US011728640B2

United States Patent
Cui et al.

(10) Patent No.: US 11,728,640 B2
(45) Date of Patent: Aug. 15, 2023

(54) SECURED FAULT DETECTION IN A POWER SUBSTATION

(71) Applicant: Hitachi Energy Switzerland AG, Baden (CH)

(72) Inventors: Tao Cui, Raleigh, NC (US); Reynaldo Nuqui, Cary, NC (US); Dmitry Ishchenko, Cary, NC (US); Zhenyuan Wang, Morrisville, NC (US)

(73) Assignee: HITACHI ENERGY SWITZERLAND AG, Baden (CH)

( * ) Notice: Subject to any disclaimer, the term of this patent is extended or adjusted under 35 U.S.C. 154(b) by 582 days.

(21) Appl. No.: 16/838,766

(22) Filed: Apr. 2, 2020

(65) Prior Publication Data
US 2020/0358283 A1 Nov. 12, 2020

Related U.S. Application Data

(62) Division of application No. 15/075,845, filed on Mar. 21, 2016, now Pat. No. 10,651,645.
(Continued)

(51) Int. Cl.
*H02H 7/26* (2006.01)
*H02H 7/28* (2006.01)
(Continued)

(52) U.S. Cl.
CPC .............. *H02H 7/28* (2013.01); *H02H 7/261* (2013.01); *G01R 31/08* (2013.01); *H02H 1/04* (2013.01); *H02H 1/043* (2013.01); *H02H 1/046* (2013.01)

(58) Field of Classification Search
CPC .......... H02H 1/04; H02H 1/043; H02H 1/046; H02H 7/28; H02H 7/261
See application file for complete search history.

(56) References Cited

U.S. PATENT DOCUMENTS 5,729,144 A     3/1998   Cummins
5,835,319 A *  11/1998   Welles, II ............ H02H 1/0015
                                                          361/93.6
(Continued)

FOREIGN PATENT DOCUMENTS

CN      101345414 A   1/2009
CN      101640410 A   2/2010
(Continued)

OTHER PUBLICATIONS

International Search Report issued in International application No. PCT/US2016/023397, dated Jun. 16, 2016 (2 pages).
(Continued)

*Primary Examiner* — Bryan R Perez
(74) *Attorney, Agent, or Firm* — Slater Matsil, LLP

(57) ABSTRACT

Systems and methods for fault detection and protection in electric power systems that evaluates electromagnetic transients caused by faults. A fault can be detected using sampled data from a first monitored point in the power system. Detection of fault transients and associated characteristics, including transient direction, can also be extracted through evaluation of sample data from other monitored points in the power system. A monitoring device can evaluate whether to trip a switching device in response to the detection of the fault and based on confirmation of an indication of detection of fault transients at the other monitored points of the power system. The determination of whether to trip or activate the switching device can also be based on other factors, including the timing of receipt of an indication of the detection of the fault transients and/or an evaluation of the characteristics of the detected transients.

10 Claims, 11 Drawing Sheets

Related U.S. Application Data

(60) Provisional application No. 62/135,469, filed on Mar. 19, 2015.

(51) Int. Cl.
*G01R 31/08* (2020.01)
*H02H 1/04* (2006.01)

(56) References Cited

U.S. PATENT DOCUMENTS

| | | | |
|---|---|---|---|
| 10,281,514 | B2 | 5/2019 | Aebersold |
| 2005/0018371 | A1 | 1/2005 | Mladenik et al. |
| 2006/0279883 | A1 | 12/2006 | Elms et al. |
| 2007/0285857 | A1 | 12/2007 | Berkowitz et al. |
| 2008/0232005 | A1 | 9/2008 | Kuehnle et al. |
| 2009/0295231 | A1 | 12/2009 | Gaffney et al. |
| 2010/0185336 | A1* | 7/2010 | Rovnyak .......... H02J 3/38 700/287 |
| 2011/0141644 | A1 | 6/2011 | Hastings et al. |
| 2012/0123708 | A1 | 5/2012 | Dong et al. |
| 2013/0218359 | A1 | 8/2013 | Dadash Zadeh et al. |
| 2014/0336959 | A1 | 11/2014 | Thomas et al. |
| 2016/0224083 | A1* | 8/2016 | Dent .......... G06F 13/4282 |
| 2017/0307676 | A1 | 10/2017 | Gaouda et al. |

FOREIGN PATENT DOCUMENTS

| | | |
|---|---|---|
| CN | 101858948 A | 10/2010 |
| WO | 97/08562 A1 | 3/1997 |

OTHER PUBLICATIONS

Written Opinion issued in International application No. PCT/US2016/023397, dated Jun. 16, 2016 (9 pages).

International Preliminary Report on Patentability issued in International application No. PCT/US2016/023397, dated Sep. 16, 2017 (10 pages).

European Patent Office, Extended European Search Report issued in corresponding European application No. 16765891.3, dated Nov. 6, 2018, 3 pp.

The Patent Office of the People's Republic of China, Notification of the First Office Action issued in corresponding Chinese application No. 201680029291.4, dated Dec. 5, 2018, 4 pp.

* cited by examiner

Figure 1D
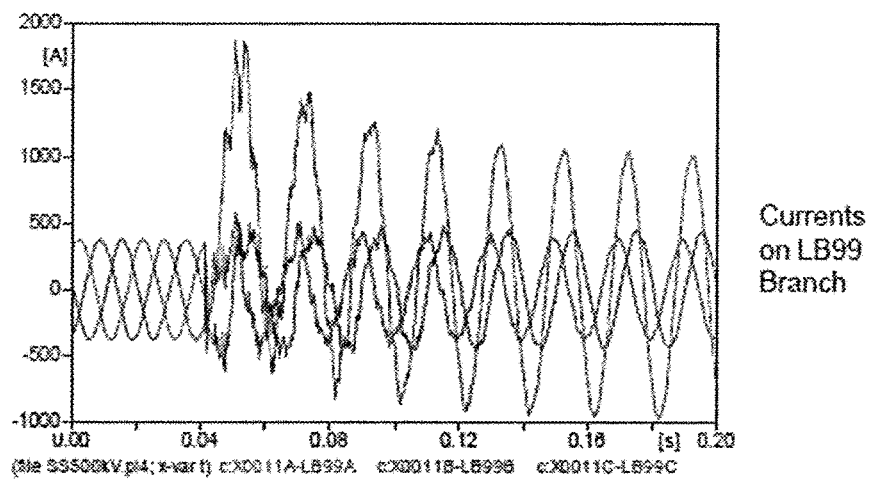
Currents on LB99 Branch
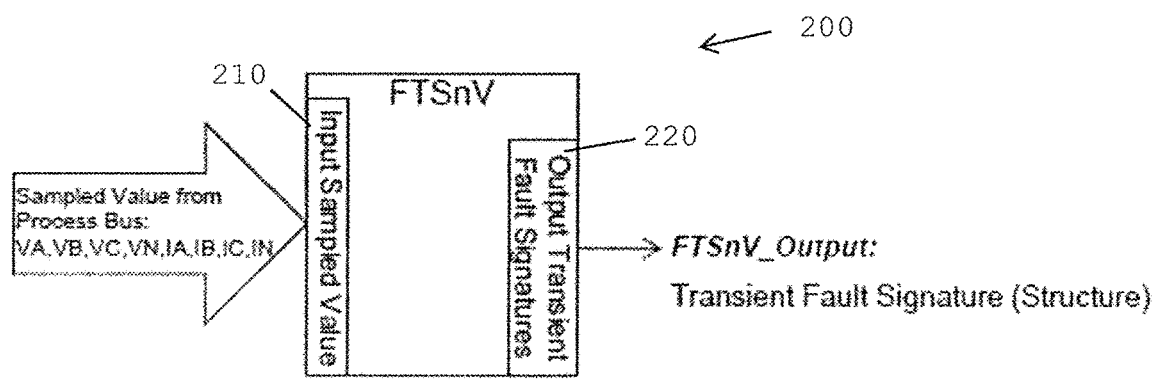
*Figure 2*

SECURED FAULT DETECTION IN A POWER SUBSTATION

CROSS REFERENCE TO RELATED APPLICATIONS

The present application is a divisional of U.S. patent application Ser. No. 15/075,845, filed Mar. 21, 2016, which claims the benefit of U.S. Provisional Patent Application Ser. No. 62/135,469, filed Mar. 19, 2015, both of which are incorporated herein by reference in their entirety.

STATEMENT REGARDING FEDERALLY SPONSORED RESEARCH

This invention was made with U.S. Government support under Cooperative Agreement No. DE-0E0000674 awarded by the U.S. Department of Energy (DOE). The Government has certain rights in the invention.

BACKGROUND

Embodiments of the present application generally relate to fault detection. More particularly, but not exclusively, embodiments of the present application relate to fault detection and the activation of protection devices in electric power systems.

Intelligent Electronic Devices (IEDs) are microprocessor-based devices used by the electric power industry to control power system switching devices, such as, for example, circuit breakers and reclosers, among other devices. With the standardization by the International Electrotechnical Commission (IEC) of the IEC 61850 process bus, many modern IEDs support voltage and current inputs in a digital format, as Sampled Value (SV) streams transmitted as Ethernet packets on the process bus. In implementations according to the IEC 61850-9-2 specifications, a merging unit (MU) is the device that samples the analog measurements, such as, for example, voltages and currents, of the primary high voltage power circuit, encodes the measurement values into Ethernet packets, and injects them onto the process bus. The IED can receive these SV packets from the process bus, and process and use the SV as inputs to its various fault detection and protection functions.

Primary functions of at least certain IEDs can be to detect the occurrence of a fault on the primary circuit and to issue a trip command to activate a switching device that can disconnect the faulty or shorted parts of the circuit. During such processes, the analog inputs to the MUs and the associated digitized SV packets can be critical to the proper operation decision(s) of the IEDs. Moreover, proper operation of IEDs can be based, at least part, on the accuracy, as well as the authenticity, of the information contained in the SV packets.

Additionally, traditionally, most fault detection algorithms in modern IEDs rely on monitoring of fundamental sinusoidal voltage and current, also referred to as phasors, quantities for fault detection. Thus, at least certain information relating to fast electromagnetic transients that propagate over a primary circuit in response to a fault or short circuit are usually suppressed by digital or analog filters prior to an evaluation of the measurements for fault detection. As a result, traditional fault detection and protection systems often simply ignore fault transients.

Further, compared to at least earlier protection systems that relied on hardwired analog inputs, digitized SV streams and Ethernet technology can have certain susceptibility to cyber-attacks, including, for example, illicit attacks that can be directed to at least the digitized sample value data. For example, in at least certain systems, once gaining access to the process bus and/or to a merging unit, an attacker can modify the SV packets received by the corresponding IED, and thus can manipulate the protection system, which can potentially cause relatively serious consequences to the associated power grid. For example, a false trip on normally healthy circuits could cause the system to weaken in such a way that might lead to localized or regional grid collapse. Accordingly, techniques and devices are needed for securing the IED system against cyber-attacks on sampled value data used for fault detection.

BRIEF SUMMARY

An aspect of the present application is a method that includes detecting a fault in a power system and detecting one or more fault transients. The method can also include determining to trip a switching device of a power system in response to the detected fault and the detected one or more fault transients.

Another aspect of the present application is a monitoring device for a power system that includes a first interface circuit that can be configured to receive a first sampled data of a first monitored point in the power system. The monitoring device can also include a signal processing circuit that is configured to detect, using the received first sampled data, a fault in the power system. Additionally, the monitoring device can include a second interface circuit that can be configured to receive at least one fault transient report from at least one other monitoring device that indicates a detection at at least another monitored point of a fault transient. Further, the signal processing circuit can be configured to, in response to the detection of the fault and receipt of the at least one fault transient report, determine whether to issue a command to trip a power system switching device of the power system.

Additionally, an aspect of the present application is a method that includes receiving, by a monitoring device, sampled data for a monitored point in a power system and detecting, by the monitoring device and using the sampled data, an electromagnetic transient caused by a fault in the power system. The method can also include reporting the detected electromagnetic transient to at least one other monitoring device.

A further aspect of the present application is a monitoring device that includes a first interface circuit that is configured to receive first sampled data of a first monitored point in a power system. The monitoring device can also include a signal processing circuit that is configured to detect, using the first sampled data received by the first interface circuit, an electromagnetic transient caused by a fault in the power system. Additionally, the signal processing circuit can be configured to report the detected electromagnetic transient to at least one additional monitoring device in the power system.

Still further variations of the above-summarized methods are described in the detailed description that follows, as well as further variations of apparatuses configured to carry out any of one or more of these methods.

BRIEF DESCRIPTION OF THE DRAWINGS

The description herein makes reference to the accompanying figures wherein like reference numerals refer to like parts throughout the several views.

FIGS. 1B-1D illustrate currents on three branches of the exemplary digital substation depicted in FIG. 1A.

FIG. 2 illustrates an embodiment of an exemplary FTSnV module.

Figure 1A:
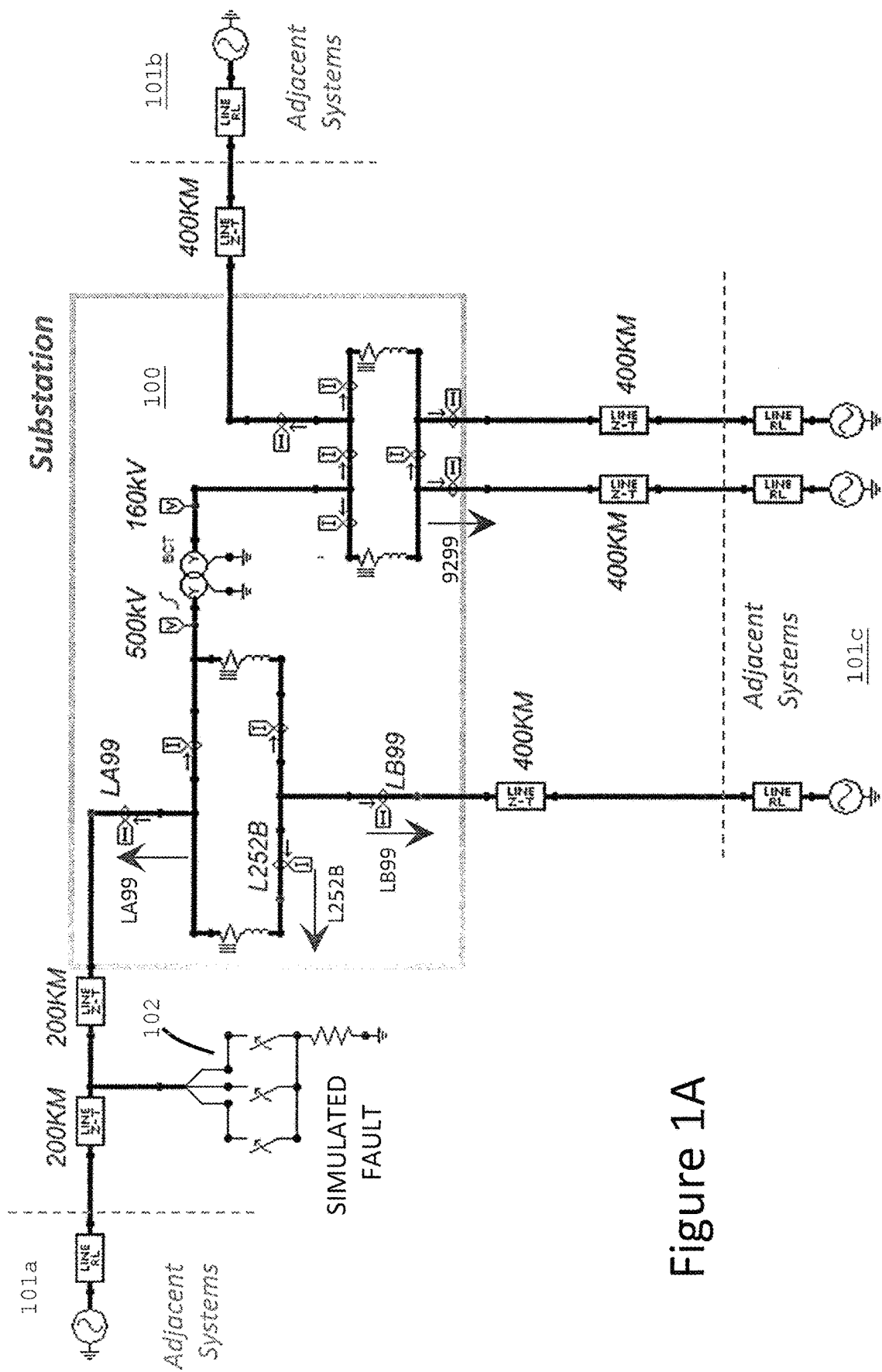
FIG. 1A illustrates an exemplary digital substation that is connected to a plurality of other adjacent systems via one or more transmission lines.

The foregoing summary, as well as the following detailed description of certain embodiments of the present invention, will be better understood when read in conjunction with the appended drawings. For the purpose of illustrating the invention, there is shown in the drawings, certain embodiments. It should be understood, however, that the present invention is not limited to the arrangements and instrumentalities shown in the attached drawings. Further, like numbers in the respective figures indicate like or comparable parts.

DESCRIPTION OF THE ILLUSTRATED EMBODIMENTS

Certain terminology is used in the foregoing description for convenience and is not intended to be limiting. Words such as "upper," "lower," "top," "bottom," "first," and "second" designate directions in the drawings to which reference is made. This terminology includes the words specifically noted above, derivatives thereof, and words of similar import. Additionally, the words "a" and "one" are defined as including one or more of the referenced item unless specifically noted. The phrase "at least one of" followed by a list of two or more items, such as "A, B or C," means any individual one of A, B or C, as well as any combination thereof. Further, as used herein, the terms "having", "containing", "including", "comprising" and the like are open-ended terms that indicate the presence of stated elements or features but that do not preclude additional elements or features.

A fault, such as, for example, a short circuit, in a power system usually involves a relatively sudden change of the electrical quantities, such as, for example, changes voltages and currents, at one or more points in the circuit. For at least certain types of circuits, changes in such electrical quantities can propagate over a primary circuit and generate relatively fast electromagnetic transients that can be observed on multiple nodes or branches in the primary circuit. These fast electromagnetic transients, which are referred to herein as "fast fault transients" or simply "fault transients", can correspond to the electromagnetic transient propagating through the primary circuit immediately after the fault and before a relay responds to the fault. The fast fault transient can arise, for example, due to the fault-triggered sudden discharge of the electrical energy stored in the line capacitance, and is generally characterized by damped high-frequency (up to several kHz) oscillations in the voltage and current waveforms on the circuit. The fast transient can be explained by electromagnetic (EM) theory, and has been extensively studied in the field of EM transient and traveling wave based fault detection and protection research.

As discussed below in more detail, according to certain embodiments of the present application, a fault-transient signature and verification (FTSnV) may be utilized for secured fault detection. More specifically, according to certain embodiments, a fast fault transient(s) propagating on the primary circuit can be detected and a fault signature(s) can be extracted from the detected fast fault transient(s) that is used to verify a fault detection decision by cross-checking the fault transient signature(s) from multiple locations on the primary circuit within a substation.

FIG. 1A illustrates an exemplary digital substation 100 that is connected to a plurality of other adjacent systems 101a, 101b, 101c via one or more transmission lines. According to the illustrated exemplary embodiment, the digital substation 100 includes a 500 kV side and a 160 kV side. Additionally, the substation 100 includes one or more sensors or detection devices at a plurality of monitored points (LA99, LB99, L252B, 9299) in the substation 100 that are structured to detect one or more electrical quantities of the digital substation, such as, for example, detect or measure a current or load, among other electrical quantities. For example, according to the illustrated embodiment, the substation 100 is depicted as having three sensors or detection devices that measure three-phase current at a plurality of monitoring points (LA99, LB99, L252B, 9299) in the substation 100.

Figures 1B, 1C:
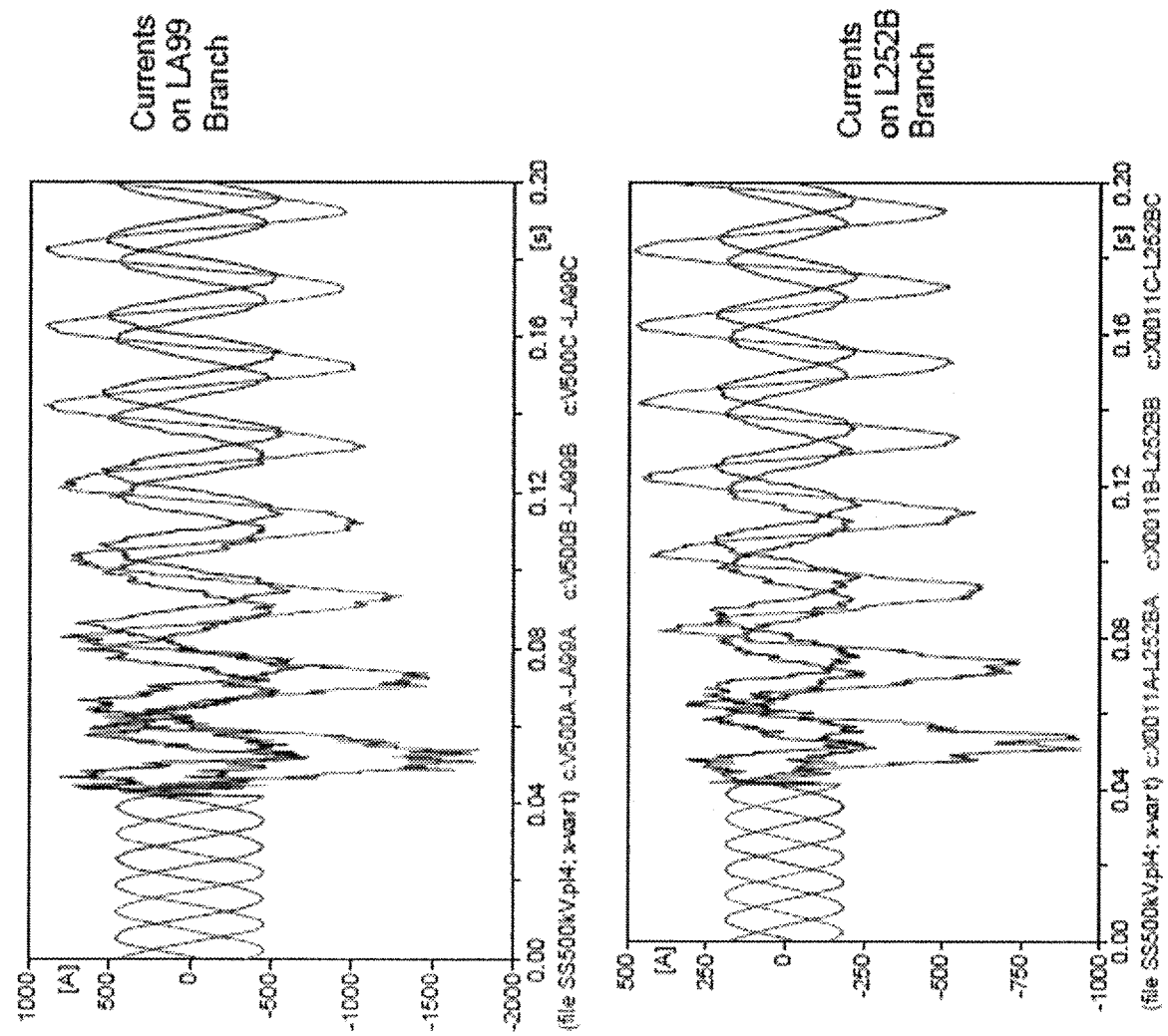

For purposes of illustration, a switch 102 shown on the left side of the substation 100 in FIG. 1A can be operated to simulate a fault on the transmission line that connects the adjacent system 101a to the 500 kV side of the substation 100. In such a situation, immediately after the fault inception, within the first half cycle, relatively high frequency fault transient currents can be sensed or measured by at least the sensors or detection devices on multiple branches in the network or circuit of the substation 100, including, for example, at points LA99, LB99, L252B, and 9299. Further, FIGS. 1B, 1C, and 1D depicted exemplary measured currents at monitored points LA99, L252B, and LB99, respectively, upon the occurrence of the fault, which is shown as occurring around 0.04 seconds, and the measured current thereafter.

Fast transients can have characteristic "signatures" that are inherently encoded in the fast transients for a given circuit configuration. Moreover, according to certain embodiments of the present application, one or more of a plurality of features of fast fault transients can be exploited by one or more fault detection algorithms of an Intelligent Electronic Device (IED). Such use of features of fast fault transients can provide defenses against cyber-attacks on sampled value. For example, a fast transient can carry physical fault signatures that indicate or characterize the direction of the fault, relative to a monitoring device, a fault phase, and/or a fault location. Thus, embodiments of the present application can use the fast fault transient for more than mere fault detection. Further, fast fault transients typically propagate on the primary circuit as EM waves, which can be sensed more quickly than most phasor-based fault detection algorithms operate. More specifically, algorithms based on phasors typically have to make extra calculations to transform the fault signals from time domain to phasor domain, which can result in a delay in the utilization of the phasor information. Thus, the use by embodiments of the present application of the fast transients call allow for the fault signature to be verified in a shorter time period than, or before, a traditional phasor-based IED fault detection makes a protection decision. Additionally, the fast transient typically propagates over the connected primary circuit. Therefore, the primary circuit can form a communication channel for the fault signature, which can be an analog channel that is separate from the channels used to convey SVs to the IEDs. The primary circuit, which can thus be viewed as an alternative channel for communicating fault information, is generally immune to cyber-only attack. Further, the propagation through the primary circuit allows the fault signature to be verifiable on multiple locations in a collaborative way. Additionally, various methods of traveling-wave-based protection schemes can be adapted for decoding and verifying transient fault signatures.

Accordingly, disclosed herein are methods and apparatus that exploit characteristics of the fault transient to provide power system switching devices and techniques that are less susceptible to cyber-attack on the digitized analog measurement values of the sensors. In a digital substation, such as, for example, the substation 100 depicted in FIG. 1A, analog measurement inputs to the protection algorithms are digitized as sampled value (SV) streams and are transmitted to one or more Intelligent Electronic Devices (IEDs) on a process bus. According to some of the disclosed methods, a physical fault transient signature is extracted from a fast fault transient propagating on the primary circuit and cross-checked against fault transient signatures corresponding to one or more other measurement locations to verify the validity of the protection system's fault detection decision.

Some embodiments of the systems described herein include one or more devices or firmware modules that take sampled value streams as inputs and extract fault transient signatures from the sampled values. The extracted fault transient signatures can be outputted and cross-checked with fault transient signatures from multiple measurement sources. Such cross checking of fault transient signatures can be used to verify the fault detection decision of the main protection. Additionally, several different configurations for the disclosed systems are possible, depending, for example, on architecture of the electrical and communication network and the processing power of the electronic monitoring and control devices.

The ability to detect fault transients, using sampled current and/or voltage data for a monitored point in the power system can be attained in a variety of manners. For example, according to certain embodiments, such capability can be provided by a fault transient signature and verification (FTSnV) module, which can serve as a building block in a secured fault detection system. The FTSnV module can be adapted to extract a fault transient signature(s) from a sampled value stream(s), such as, for example, by use of digital signal processing techniques, and provide the extracted transient fault signature(s) to neighboring IEDs According to certain embodiments, such extracted transient fault signature(s) can be used in connection with verifying a main phasor based tripping decision of a protection system. The extracted signature can provide a variety of different types of information, and/or combinations of information or characteristics relating to the fault transient including, for example, an indication that the fault transient exceeds a certain amplitude, on indication of a direction of the fault transient relative to the monitoring device, and/or a time stamp for the fault transient, among other information or characteristics.

FIG. 2 illustrates a conceptual view of an exemplary FTSnV module 200, having an input interface 210 and an output interface 220. An example of information that can be conveyed through the input and output interfaces 210 and 220 of the depicted FTSnV module 200 is provided in detailed in Table 1.

TABLE 1

| I/O | Name | Type | Description | Comment |
|---|---|---|---|---|
| Input | VA, VB, VC, VN | Sampled Value | Real-time sampled values of phase and neutral voltages | SV stream of real-time measurements |
| | IA, IB, IC, IN | Sampled Value | Real-time sampled values of phase and neutral currents | |
| Output | FTSnV_Output | Structure | One or more levels of transient fault signatures | See Table 2 for details of levels |

As shown above, according to certain embodiments, the information that can be conveyed through the input and output interface 210 of the depicted FTSnV module 200 can include one or more real time sampled values of phase voltages (VA, VB, VC) and neutral voltages (VN), and one or more real time sampled values of phase currents (IA, IB, IC) and neutral currents (IN).

As previously discussed, according to certain embodiments, the FTSnV module 200 can output ("FTSnV_Output" in FIG. 2) an extracted fault signature that can comprise, for example, an indication that the fault transient exceeds a certain amplitude. However, as also previously discussed, the outputted FTSnV module 200 may also comprise other or additional information, such as, for example, an indication of the actual magnitude of the fault transient, an indication of a direction of the fault transient, and/or a time stamp for the fault transient, among other information. Table 2 illustrates examples of two levels ("Level 1" and "Level 2") of fault transient signatures that can, according to certain embodiments, be reported as part of the "FTSnV_Output" shown in FIG. 2.

TABLE 2

| | Description | Content |
|---|---|---|
| Level 1 | Transient Pickup | Maximum amplitude of the transient within delay window of the pickup process |
| Level 2 | Fault Transient Characteristics | One or more levels of transient fault signatures, such as the direction of the fault transient |

As shown above in Table 2, according to certain embodiments, first level ("Level 1") fault transient signatures can be described as pertaining to transient pickup, and can be reported with the "FTSnV_Output". Further, according to certain embodiments, the first level fault transient signatures can comprise transient pickup information such as, for example, maximum amplitude of the fault transient within a delay window of the pickup process, among other information. Such first level fault transient signatures can be utilized for relatively fast and reliable confirmation of the existence of the fault transient.

Analysis of second level ("Level 2") fault transient signatures can be triggered by a detection of the first level ("Level 1") fault transient signatures, or transit pickup, and can be described as pertaining to one or more fault transient characteristics. For example, according to certain embodiments, the second level ("Level 2") fault transient signatures can comprise information regarding, for example, one or more levels of transient fault signatures, including, but not limited to, information indicating the direction of the fault transient. According to certain embodiments, analysis of the first and second level transient fault signatures shown in Table 2 can be used to extract at least the above-identified information from an inputted sampled value stream that is received by the FTSnV module 200. Moreover, as discussed below, analysis of the first and second level fault transient signatures can be used to provide secured fault detection in a power system.

Figure 3:
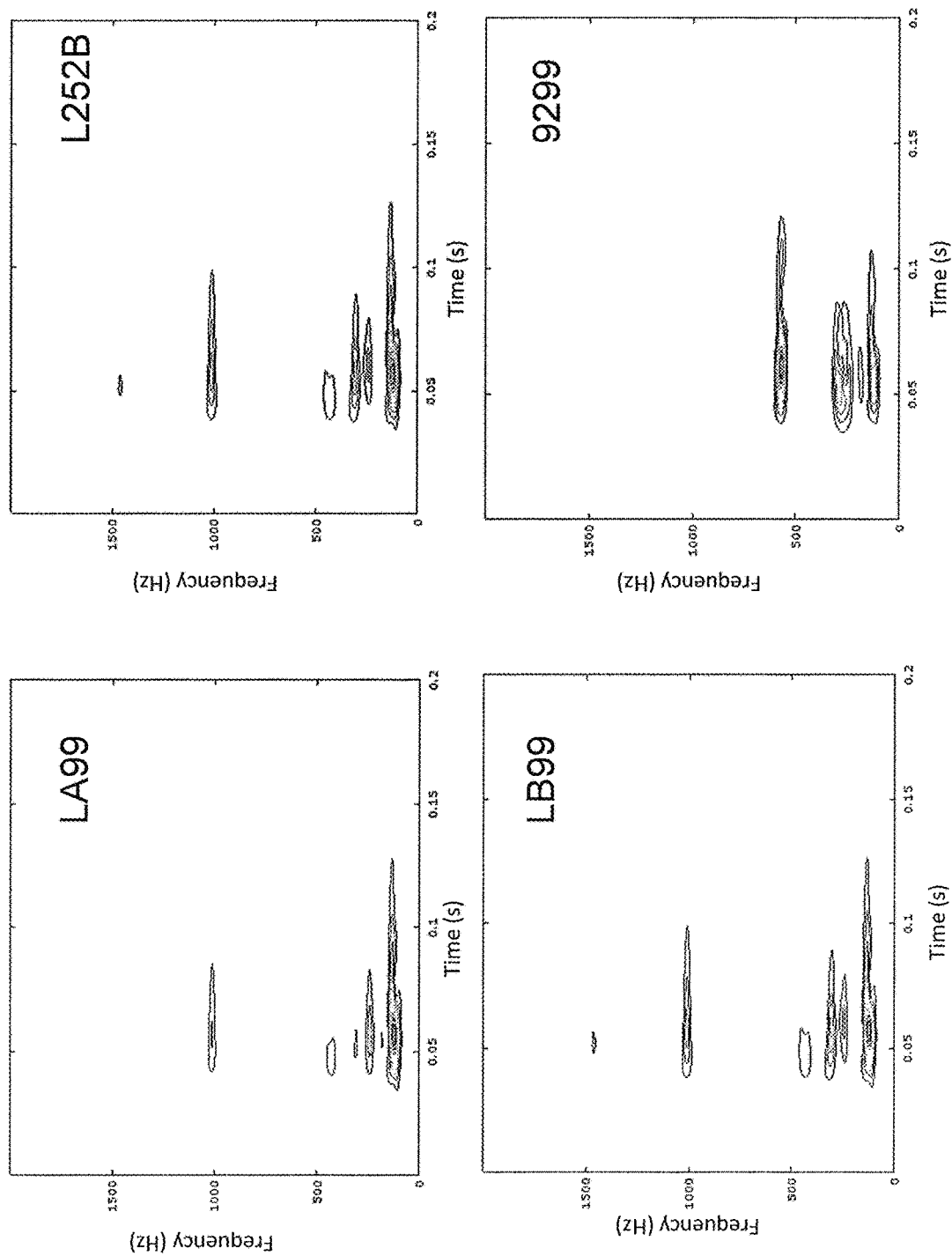
FIG. 3 illustrates four frequency-domain representations of an electromagnetic transient caused by a fault at each of four points in the exemplary digital substation scenario depicted in FIG. 1A.

FIG. 3 illustrates an example of the temporal-spectral analysis of fault current signals measured by sensors at four different monitored points (LA99, LB99, L252B, 9299) in the substation 100 shown in FIG. 1A under the previously discussed simulated fault scenario, with the X axis representing time and the Y axis representing frequency in hertz (Hz). Moreover, FIG. 3 illustrates contour plots showing the distribution of different frequency components over time as measured at each of the different locations in the substation 100 following the occurrence of the fault, which in the illustrated example occurs around 0.04 seconds. In each of these plots, the fundamental frequency has been filtered so that the plots depict other features of the fast transient. As demonstrated, the fault transients can be observed at multiple locations in the substation 100, such as, for example, at the four monitored points (LA99, LB99, L252B, and 9299) depicted by the plots of FIG. 3 and shown in the substation 100 depicted in FIG. 1A. As discussed below in more detail, a first level transient analysis, or transient pickup process, can analyze these high-frequency components to determine the presence of the fast transient and to trigger the FTSnV module 200 to take further action.

Figure 4A:
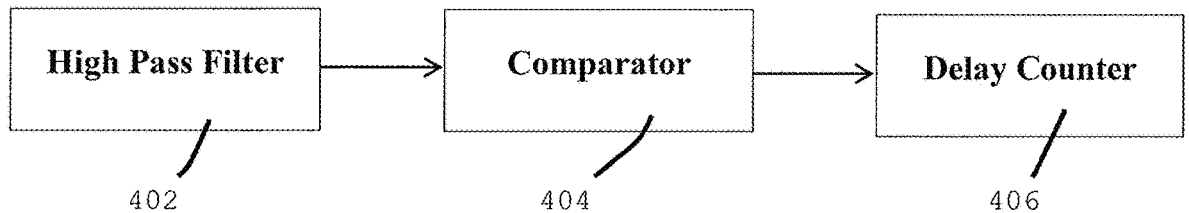
FIG. 4A illustrates exemplary components adapted for used in a transient detection process according to certain embodiments of the present application.

According to certain embodiments, the first level transient analysis is primarily concerned with first level ("Level 1") fault transient signatures or transient pickup, and more particularly, the high-frequency components of the fast transient signals. Accordingly, referencing FIG. 4A, according to certain embodiments of the present application, the first level transient analysis can be a transient detection process that includes the use of, at least in part, a high-pass filter 402, a comparator 404, and a delay counter 406. The high-pass filter 402 can be adapted to have a cut-off frequency that is higher than an electric power frequency and which is also lower than the lowest natural frequency of any of the major transmission lines in the system. Further, the high-pass filter 402 can be adapted to have a maximum group delay that is less than a quarter cycle of the fundamental electric power signal. According to certain embodiments, this maximum group delay may correspond to, for example, about 20 consecutive samples to about 64 consecutive samples in the sampled value (SV) data stream. The high-pass filter 402 can be applied to sampled values of the current and/or voltage at a monitored point and output filtered sample values. An absolute amplitude of the filtered sample values can be compared, by the comparator 404, to a threshold. Further, the delay counter 406 may be used to distinguish the high frequency component from bad data or noise. In other words, according to certain embodiments, the sampled values must exceed the threshold for a given period of time or duration, such as, for example, a given number of samples, in order to qualify as a true fault transient.

Figure 4B:
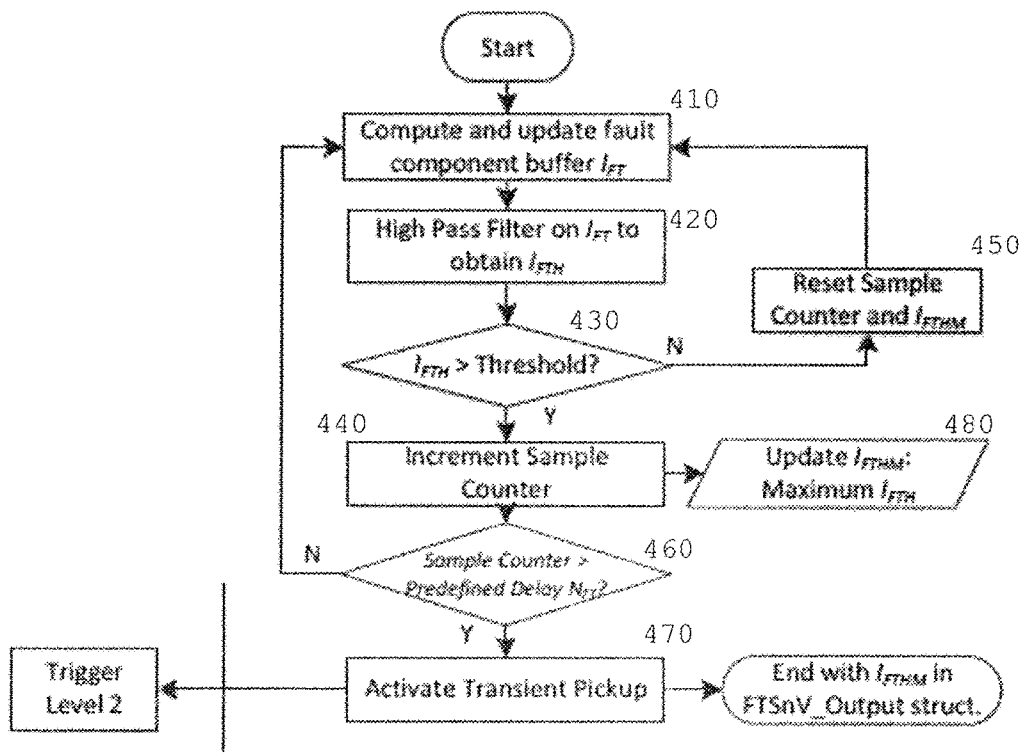
FIG. 4B illustrates a process flow diagram of an exemplary method of fault transient detection.

A process flow diagram illustrating an example of a first level transient analysis, and more specifically, a transient detection process, is shown by the algorithm depicted in FIG. 4B. The operations illustrated for all of the processes in the present application are understood to be examples only, and operations may be combined or divided, and added or removed, as well as re-ordered in whole or in part, unless explicitly stated to the contrary. Further, according to certain embodiments, the illustrated transient detection process can be carried out on sampled current values, sampled voltage values, and/or a combination of both sampled current and sampled voltage values. Further, according to certain embodiments, the illustrated process flow may be iterated at every monitored point. At each monitored point, the process can first update the fault component current buffer ($I_{FT}$), as shown at block 410. A high-pass filtering algorithm can then be applied on the component current buffer ($I_{FT}$) to obtain a filtered current buffer ($I_{FTH}$), which can be the absolute value of the most recent high-pass filter output, as shown at block 420. As shown at block 430, the filtered current buffer ($I_{FTH}$) can be compared to a threshold. If the filtered current buffer ($I_{FTH}$) is greater than the threshold for the first time, then a counter is started. The counter can then be incremented each time the filtered current buffer ($I_{FTH}$) at successive execution points is also greater than the threshold, as shown at block 440. However, upon the filtered current buffer ($I_{FTH}$), such as, for example the next filtered current buffer ($I_{FTH}$), is less than the threshold, then the counter is reset, as shown at block 450.

As shown at block 460, the counter value is compared to a threshold delay value ($N_{FT}$). When the counter reaches or exceeds the threshold delay value ($N_{FT}$), such that the consecutive points of the high-frequency components of the fast transient signals, as discussed above with respect to at least FIGS. 4A and 4B, have been equal to or greater than the threshold, then the process will confirm a transient is detected and send out the pickup signals as shown at block 470. Additionally, with the counter reaching or exceeding the threshold delay value ($N_{FT}$), the value of a maximum filtered current buffer ($I_{FTHM}$) can be updated with the peak value of the filtered current buffer ($I_{FTH}$) that was obtained or measured during the counter delay process, as shown at block 480. According to certain embodiments, the updated maximum filtered current buffer ($I_{FTHM}$) can be put into the FTSnV_Output results outputted by the FTSnV module 200 as the amplitude of the fault transient.

The process flow diagram described above and depicted in FIG. 4B provides an example of a first level transient analysis, or transient detection process. However, according to other embodiments of monitoring devices of the present application, the transient detection process may be generally limited to a first fault transient analysis that provides an indication that a fault transient was detected, with the indication of the detection of the fault transient being sent to one or more other devices. Additionally, according to certain embodiments, such an indication of detection of a fault transient can be accompanied by a timestamp or other timing data to indicate when the fault transient was detected. Optionally, in addition to, or instead of, providing an indication of detection of a fault transient, according to certain embodiments, data indicating the fault transient amplitude, duration, or other characteristic of the fault transient may be sent to one or more other devices.

According to other embodiments, further analysis of the fault transient may be performed. Such further analysis, which can be referred to as a second, or Level 2, fault transient analysis. According to certain embodiments, the second fault transient analysis can be directed to Level 2 fault transient signatures, and can include, for example, an analysis to determine a direction(s) of a fault transient. According to certain embodiments, the direction of the fault transient can refer to a direction of propagation for the fault transient, as observed at, or relative to, a given monitored point, such as, for example, at monitored points LA99, LB99, L252B, 9299. Additionally, according to certain embodiments, the sampled value data stream for measured current and/or voltage at a given monitored point may be analyzed to determine the fault transient direction. For example, when a fault occurs, if the sampled value data is observed, there can be a fault component circuit superimposed on the original circuit, producing incremental voltages and currents caused by the fault. In such a fault component circuit, the fault is the source to the rest of the circuit. Therefore, the transient power/energy generated by the fault can be viewed as flowing from the fault point to the rest of the circuit. Thus, the second fault transient analysis can be employed to extract an energy direction as a physical signature from the transient waveform and use the extracted direction to verify the fault from multiple sample value streams.

Figure 5:
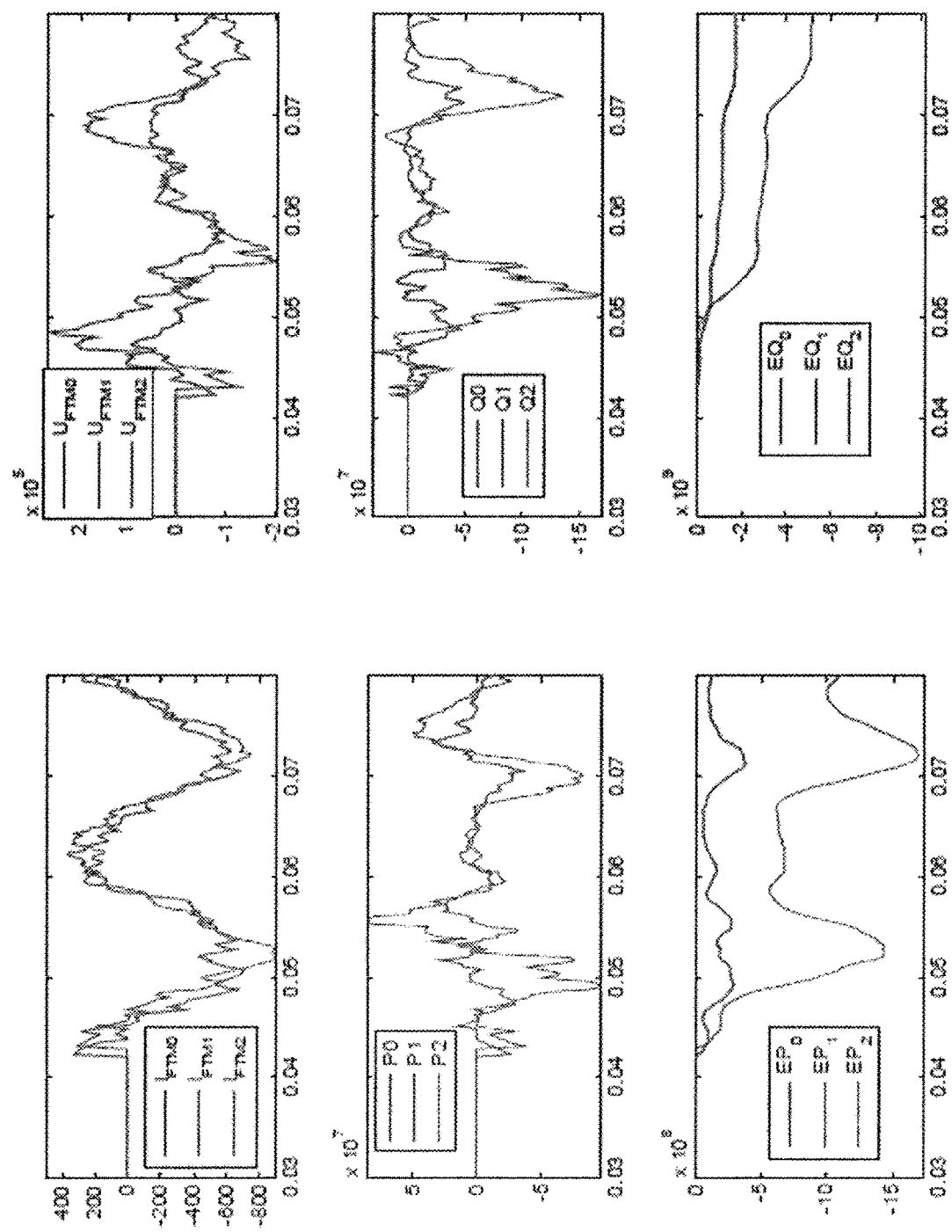
FIG. 5 illustrates graphical representations certain characteristics of a Level 2 fault transient analysis for the same fault scenario illustrated in FIG. 1A-D.

FIG. 5 illustrates certain physical characteristics of a fault transient that can be evaluated with respect to a second fault transient analysis. Further, the characteristics depicted in FIG. 5 generally relate to the example fault scenario previously discussed with respect to at least FIGS. 1A-D. The illustrated currents, voltages, powers, and energies shown in the graphs in FIG. 5 correspond to measurements by one or more sensors at location LA99 of the substation 100 illustrated in FIG. 1A, where the reference current direction is from the substation 100 to the line. Since the fault in the illustrated example is on the line in front of the one or more sensors at location LA99 of the substation 100, in the fault component circuit, the sign of the energy generated by the fault will be negative. In FIG. 5, the illustrated $I_{FTM}$ and $U_{FTM}$ quantities, which are plotted against time, are the decoupled fault component currents and voltages derived from the sampled value data. Given the illustrated $I_{FTM}$ and $U_{FTM}$, P and Q are the instantaneous active and reactive powers in the fault component circuit, respectively. The EP and EQ are the instantaneous energies in the fault component circuit. In this case, EP and EQ are always negative which indicates that the fault direction is in front of location identified as LA99 (forward direction).

Figure 6:
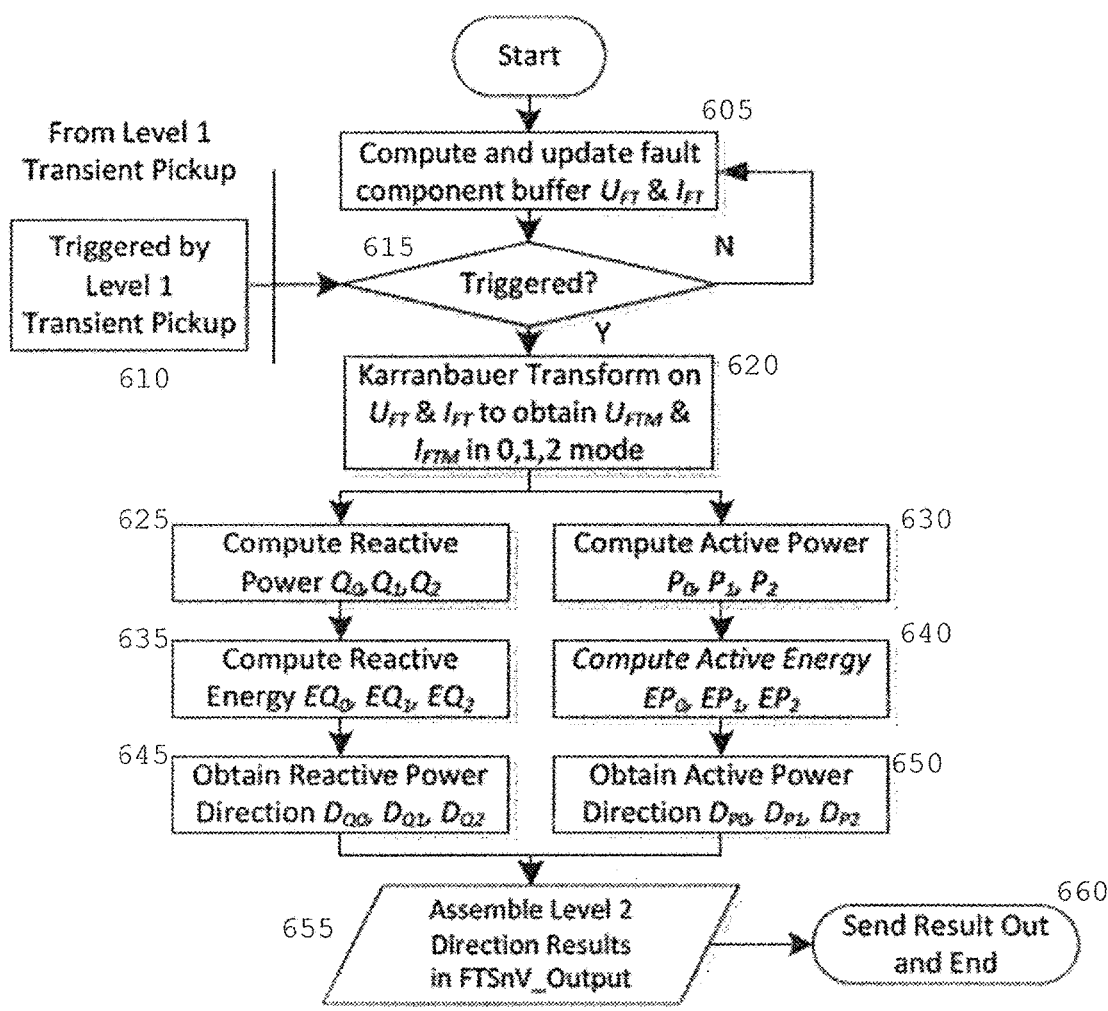
FIG. 6 illustrates a process flow diagram of an exemplary method of determining a direction for a fault transient.

FIG. 6 illustrates a process flow diagram that depicts an example algorithm for determining fault transient direction. Before the main calculations are triggered by a detection of the first level ("Level 1") fault transient signatures, or by a transient pickup, as shown at blocks 610 and 615, the algorithm depicted in FIG. 6 tracks fault component three-phase voltages ($U_{FT}=[U_{FTA}, U_{FTB}, U_{FTC}]^T$) and current ($I_{FT}=[I_{FTA}, I_{FTB}, I_{FTC}]^T$), storing those values in a fault component buffer, as shown at block 605. Once the second fault transient analysis is triggered by the transient fault detection of the first fault transient analysis, as shown at block 615, the instantaneous energy direction is calculated, which, according to certain embodiments, can be based on updating fault component current and voltage. A Karrenbauer transform is applied on the phase quantities ($U_{FT}$ and $I_{FT}$), as shown at block 620, to obtain the decoupled mode voltage ($U_{FTM}=[U_{FTM0}, U_{FTM1}, U_{FTM2}]^T$) and mode current ($I_{FTM}=[I_{FTM0}, I_{FTM1}, I_{FTM2}]^T$). The equation of this transform is shown in the below equation (Eq. 1), with X being either the voltage (U) or current (I):

$$\begin{bmatrix} X_{FTM0} \\ X_{FTM1} \\ X_{FTM2} \end{bmatrix} = \frac{1}{3}\begin{bmatrix} 1 & 1 & 1 \\ 1 & -1 & 0 \\ 1 & 0 & -1 \end{bmatrix}\begin{bmatrix} X_{FTA} \\ X_{FTB} \\ X_{FTC} \end{bmatrix} \qquad \text{Eq. (1)}$$

After the transform, the instantaneous active power (P0, P1, P2) and reactive power (Q0, Q1, Q2) are calculated using a Hilbert transform-based reactive power definition, as shown at blocks 625 and 630. These instantaneous power values are then accumulated at every sample, as shown at blocks 635 and 640, to form the instantaneous active energy and reactive energy (EP0, EP1, EP2 and EQ0, EQ1, EQ2). The signs of these energy values during the first cycle of the fault are used to obtain the fault transient direction, as shown at blocks 645 and 650, and can be used as details for the Level 2 fault transient signature output by the monitoring device, such as, for example, outputted by the FTSnV module 200, as shown at blocks 655 and 660. Positive sign values indicate the reverse direction, while negative sign values indicate the forward direction.

Figure 7:
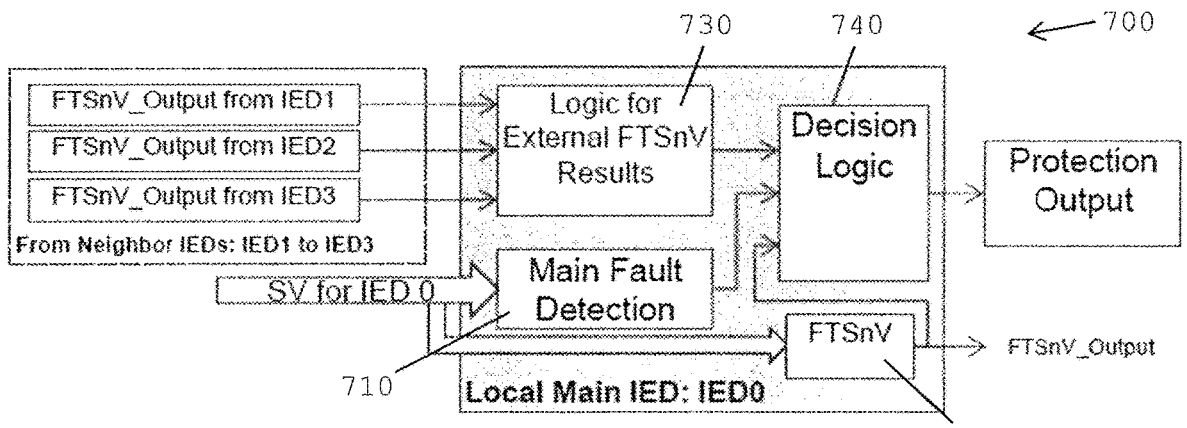
FIG. 7 illustrates an exemplary logical setup for a monitoring device configuration.

FIG. 7 illustrates the logical setup for an exemplary monitoring device configuration, using the example FTSnV described above, and which can be used to determine whether to output a control signal to activate, or trip, a switching device. For purposes of illustration, in example setup depicted in FIG. 7, the fault is assumed to have occurred in the main protection zone of the IED 700. According to the illustrated embodiment, the monitoring device configuration includes an IED 700, denoted in FIG. 7 as "IED0", which includes a main fault detection module 710. In the illustrated example, the main fault detection mode 710 can be configured to carry out phasor-based fault detection based on the sampled value (SV) data for a first monitored point in the system. The IED700 can also include a fault transient analysis module 720, also referred to as an FTSnV module 720. The FTSnV module 720 is structured to pick up the fault transient by monitoring the instantaneous sampled values, such as, for example, by employing a previously discussed first level transient analysis, and extracts one or more transient fault characteristics from the SV, such as, for example, via use of a previously discussed second level transient analysis. As shown in FIG. 7, the FTSnV module 720, and thus the IED 700, can then output an FTSnV_Output, which can include information obtained by the first and/or second level transient analyses, that can be sent to one or more neighboring IEDs.

The IED 700 also receives transient detection results from one or more neighboring IEDs (e.g. IED1, IED2, and IED3) as inputs to an external FTSnV logic unit 730. The FTSnV results of one or more of these neighboring IEDs (IED1, IED2, and IED3) can be combined with the main fault detection result from fault detection module 710, such as, for example, a result from the first level transient analysis and/or the second level transient analysis, in decision logic unit 740 of the IED 700 to produce a final protection output, as show in FIG. 7 ("Protection Output"). According to certain embodiments, the final protection output can be a control signal to activate, or "trip," a switching device, such as a circuit breaker.

The group of the IEDs referred to in the configuration illustrated in FIG. 7, i.e., IED0, IED1, IED2, IED3, can be a group of IEDs that are electrically close to each other such that the fault shall cause similar fault transients for the other IEDs in that group. Additionally, according to certain embodiments, during operation, a group of IEDs can utilize have at least two independent measurement streams from different sources, including, for example, but not limited to, measurements from two or more IEDs in the group.

A non-limiting example of the operation of the logical setup of the monitoring device configuration depicted in FIG. 7 in response to the occurrence of a in the main protection zone of the IED 700 (denoted in FIG. 7 as "IED0") is as follows. As previously mentioned, the IED 700 (IED0), as well as neighboring IEDs (IED1, IED2, IED3) can receive instantaneous sampled values (SV) data for one or more monitored points, such as from one or more sensors or detection devices within the substation associated with each IED. The IEDs (IED0, IED1, IED2, IED3) can use the associated received SV data and, via a first level transient analysis, or transient detection, detect or otherwise provide an indication of detection of a fault transient, as previously discussed. Further, as also discussed, the first level transient analysis can, according to certain embodiments, trigger a second level transient analysis. As also previously discussed, the second level transient analysis may be used by one or more of the FTSnV modules of one or more of the IEDs (IED1, IED2, IED3), as previously discussed, to extract certain characteristics of the detected fault transient, such as, for example a direction of the fault transient. Further, information from the first and second level transient analyses can be communicated via an FTSnV_Output from the FTSnV modules of one or more neighboring IEDs (IED0, IED1, IED 2, IED 3). According to the present example, as depicted in FIG. 7, the FTSnV_Output from the FTSnV modules neighboring IEDs (IED1, IED 2, IED 3) can be received by the IED 700 (IED0). Additionally, according to the illustrated embodiment, the main fault detection module 710 of the IED 700 (IED0) can utilize the received SV and pickup the fault after obtaining valid phasors, which, due to phasor calculations, can occur after about one-half to about a one cycle delay following the occurrence to the fault.

In the illustrated example, after main fault detection pickup by the main fault detection module 710, within a predefined time window, if the IED 700 (IED0) receives any FTSnV_Output from neighbor IEDs (IED1, IED2, IED3) indicating confirmed fault transients, and if the external FTSnV logic, as well as the FTSnV_Output, of the IED 700 (IED0) result confirm the transient fault signatures, the IED 700 (IED0) issues a protection output ("Protection Output" in FIG. 7) control signal to activate, or "trip," a switching device, such as a circuit breaker. However, if within a predefined time window or period after main fault detection pickup by the main fault detection module 710 the IED 700 (IED0) does not receive any FTSnV_Output with confirmed fault transients, then the IED 700 (IED0) can alarm the substation information technology (IT) system of an unverified event, such as, for example, via an "abnormal sampled value" signal. Further, according to certain embodiments, depending on a configured setting for the IED 700 (IED0), the IED 700 may either refrain from issuing a control signal to activate ("trip") a switching device or may issue a control signal to activate the switching device with reclosing logic initiated.

The above discussed example, included discussion of whether the IED 700 (IED0) receives any FTSnV_Output from neighbor IEDs (IED1, IED2, IED3) indicating confirmed fault transients. According to certain embodiments, such confirmation of receipt of FTSnV_Output from neighbor IEDs indicating confirmed fault transients can include the IED 700 (IED0) confirming the transient fault signatures received from FTSnV_Outputs of the neighbor IEDs (IED1, IED2, IED3). Given the transient pickup signal and transient direction results in the FTSnV_Output, as, again, may have been obtained via first and second level transient analyses, respectively, a flexible logic configuration can be designed for different levels of security requirements. For example, according to certain embodiments, the IED 700 (IED0) may generally use only transient pickup signals of the incoming FTSnV_Outputs of the neighboring IEDs (IEd1, IED2, IED3). Such use of only transient pickup signals can, according to certain embodiments, involve the IED 700 using, in connection with confirming the presence of a transient, a basic fault transient indication from the received FTSnV_Outputs, such as, for example, an amplitude of the fault transient as observed by each of the neighboring IEDs According to such an approach, if FTSnV modules of the neighboring IEDs (IED1, IED2, IED3) each sensed the fast transient from their local measurements, then the IED 700 (IED0) can confirm the fault if it also senses the fault by its main fault detection module 710 and/or by its local fault transient detection process.

In some embodiments, the fault direction information in the FTSnV_Output is used to form securer fault detection logic. According to this approach, not only can neighbor IEDs (IED1, IED2, IED3) sense (and signal) the detection of transients, but can also the sense and signal transient directions, which can be evaluated and/or verified by the IED 700 (IED0) with respect to the fault and/or transient(s) detected by the IED 700 (IED0). For example, in the circuit shown in FIG. 1A, the fault occurs on the line going out of the substation. With the reference direction at three monitored point (LA99, LB99, L252B) indicated by the arrows by, if, for purposes of illustration, monitored point LA99 is assumed to be a main IED and monitored points L252B and LB99 are neighboring IEDs, the combination of the direction results at the three locations (LA99, LB99, and L252B) can be used to confirm where the fault occurred. Moreover, in this example, and referencing FIG. 1A, the reference direction results at LA99 and L252B being forward, and reverse at LB99 can confirm that the fault occurred on the line going out of LA99.

Figure 8:
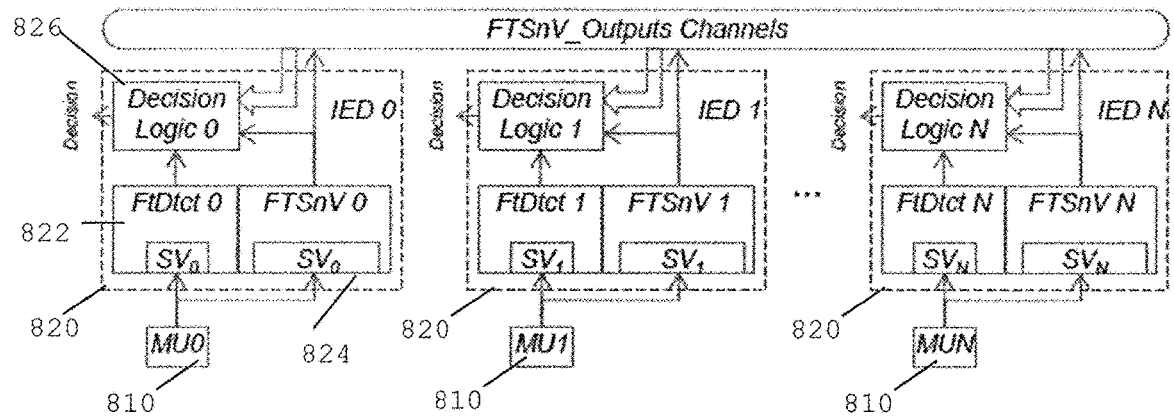
FIG. 8 illustrates a schematic diagram of an exemplary system configuration.

As discussed above, the configuration of the IED 700 (IED0) depicted in FIG. 7 is based on a system design where IEDs can receive the results of first and/or second level transient analyses from one or more neighboring IEDs (IED1, IED2, IED3), and the received results can be evaluate by the IEDs in conjunction with local fault detection/analysis performed on SV data for a local monitored point, such as, for example, analysis by a main fault detection module 710. An example system utilizing such a configuration for the IEDs is shown in FIG. 8. According to certain embodiments of such systems, each of a plurality of IEDs 820 have a corresponding merging unit (MU) 810 that provides a SV data stream for its respective IED 820 via, for example, a dedicated connection. Further, each IED 820 can include a main fault detection (FtDtct) module 822 and a fault transient analysis (FTSnV) module 824, each of which can consume the SV data stream. Similar to the IED 700 discussed above with respect to FIG. 7, each IED 820 depicted in FIG. 8 can carry its main fault detection function through the use of phasors. Additionally, the FTSnV module 824 in each IED 820 can carry out fault transient analysis using instantaneous sampled values. Further, the FTSnV module 824 in each IED 820 can output its results to neighbor IEDs 820, such as, for example, via a communication bus, for instance with a fast GOOSE message, or through physical contact I/O. At least a main IED 820, which is the IED 820 whose zone the fault occurs, can receive results from the FTSnV modules 824 of neighboring IEDs 820 as an input to a fault decision logic 826 of the main IED 820. Further, each IED 820 can receive an output from associated main fault detection (FtDtct) logic 822 of that IED 820. Based on an evaluation of these inputs, as discussed in detail above, each IED 820 can output its final fault detection decision.

In the system design shown in FIG. 8, each MU 810 is dedicated to a single IED 820. Such embodiments may increase the difficulty of illicitly physically compromising multiple SV streams, as each of the MUs 810 does not share a single communication media. Additionally, a variety of different types of sensing devices can be utilized as an MU 810, including being a type of MU that accommodates the FTSnV-based security system being compatible with other non-IEC61850 based IEDs. While the FTSnV_outputs from the IEDs 820 may, according to certain embodiments, share a single communication media, fast fault transients are generally physically and precisely synchronized with the fault, which further enhances complexities involved with an illicit attempt to simultaneously manipulate multiple FTSnV_outputs.

Figure 9:
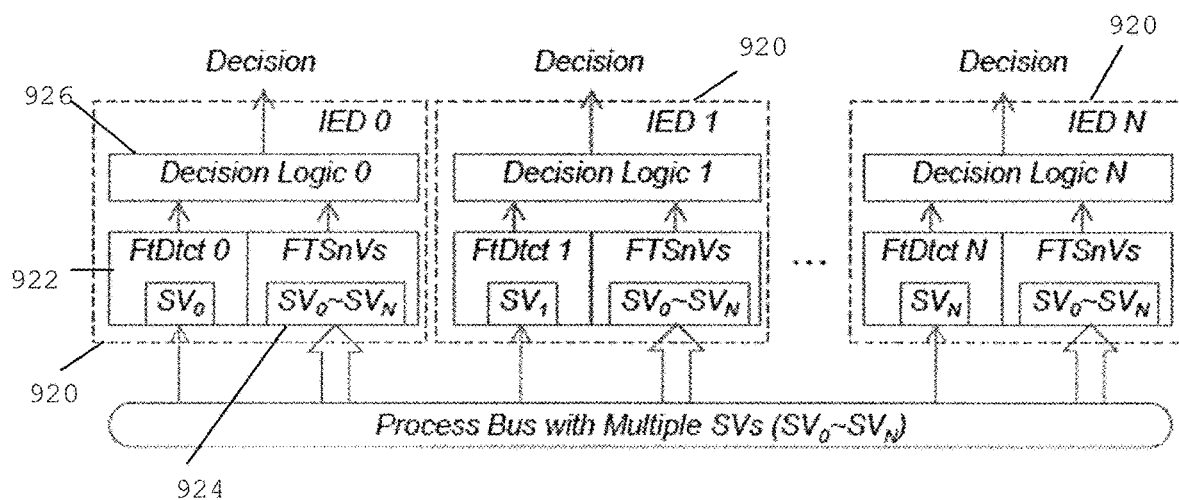
FIG. 9 illustrates a schematic diagram of another exemplary system configuration in which SV streams of neighboring IEDs are carried on the same process bus.

FIG. 9 illustrates an alternative system design where all the SV data streams of the neighbor IEDs 920 are carried on the same process bus. An FTSnV module 924 in each IED 920 receives the SV data streams of the neighbor IEDs 920, as well as its own, and locally carries out an evaluation of the fault transient on each of the neighboring IED 920 streams. The FTSnV module 924 can output all the transient results internally to its own IED 920, which can then carry out a fault detection decision logic locally using decision logic 926. Note that this decision may be also, at least in part, based on a conventional phasor-based fault detection output from the fault detection (FtDct) module 922 in the IED 920.

In the design shown in FIG. 9, the decision logics can be made locally by each of the IEDs 920, without communication between neighboring IEDs 920. However, the FTSnV module 924 in each IED 920 has to process multiple streams, thus requiring more computation power. Also, while according to certain embodiments all the SV data streams can share the same process bus, as fast fault transients are physically and precisely synchronized with the fault, such a configuration may have an enhance resistance to illicit attempts to simultaneously manipulate multiple SV streams.

Figure 10:
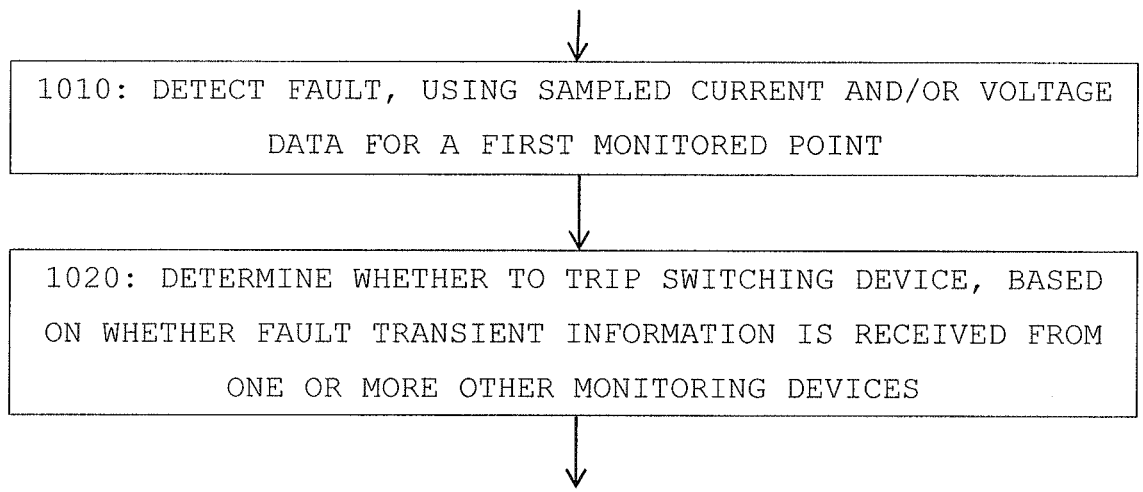
FIG. 10 illustrates an exemplary generalize process for determining whether to trip a switching device of a power system according to certain embodiments of the present application.

The preceding detailed examples provide several methods for performing fault monitoring and system protection in an electric power system. Further, FIG. 10 illustrates a process flow diagram illustrating a generalized method for performing fault monitoring and system protection according to several of the example embodiments discussed above. The method illustrated in FIG. 10 is at least suitable for implementation in a first monitoring device in a power system, such as, for example, an TED in a digital substation. According to this example method, as shown in block 1010, a fault is detected, such as, for example, detected by the first monitoring device using sampled current and/or voltage data from a first monitored point in the power system. As shown in block 1020, in response to the detection of the fault, the first monitoring device can determine whether to trip a power system switching device. Such a determination of whether to trip the switching device can, according to certain embodiments, be based on whether the first monitoring device receives from a second monitoring device, or from one or more additional other monitoring devices, fault transient information that indicates an electromagnetic transient caused by the fault (i.e., a "fast fault transient" or "fault transient" as discussed above) was detected by the second (or other) monitoring device(s) based on sampled current and/or voltage data for a second (or other additional) monitored point(s) in the power system.

Figure 11:
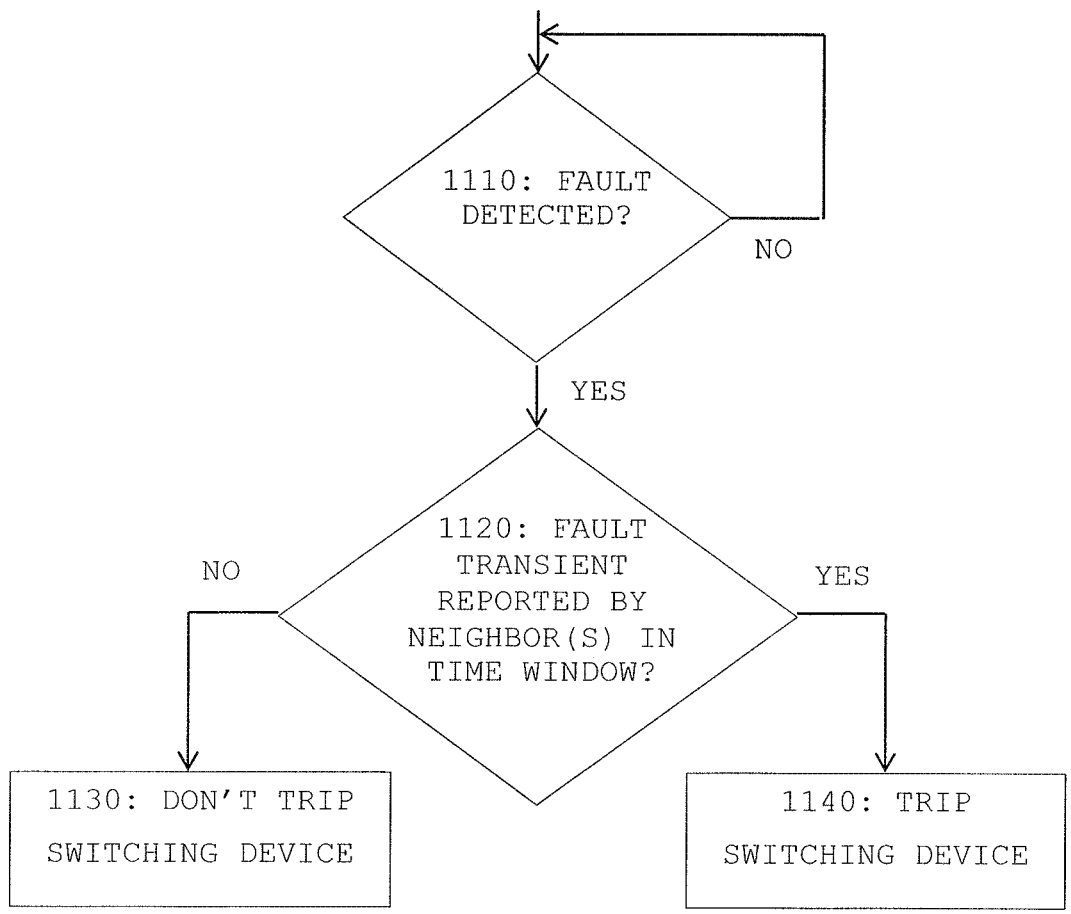
FIG. 11 illustrates an exemplary process for verifying the presence of a fault in connection with determining whether to trip a switching device of a power system according to certain embodiments of the present application.

An example process flow corresponding to the determining operation shown in block 1020 of FIG. 10 is further illustrated in FIG. 11. The illustrated process, as shown at block 1110, is triggered by the detection of a fault. For example, according to certain embodiments, the detection of a fault may by the first monitoring device may and based on a main fault detection pickup of the fault through the use of valid phasors calculations and/or via detection of fault transient(s) via first and/or second level transient analysis (es), as previously discussed. At block 1120, a decision can be made as to whether to trip the circuit breaker or other switching device. According to certain embodiments, the decision to activate or trip the circuit breaker or switching device can be based on whether appropriate fault transient information is reported by one or more neighbor monitoring devices in a predetermined time window. As previously mentioned, according to certain embodiments, the predetermined time window can be a time period after the first monitoring device determines a fault and/or fault transient is detected, as shown in block 1110. Thus, according to certain embodiments, determining whether to trip the power system switching device, as shown in block 1120, can include determining not to trip the power system switching device, as shown at block 1130, upon failing to receive from at least a second monitoring device, within a predetermined interval that begins upon detecting the fault (as shown in block 1110), fault transient information from that indicates the detection by the at least second monitoring device of an electromagnetic transient caused by the fault. Similarly, according to certain embodiments, determining whether to trip the power system switching device by the first monitoring device, as shown at block 1140, can include determining that fault transient information from the at least second monitoring device indicating the detection of an electromagnetic transient caused by the fault was received by the first monitoring device within the predetermined interval after detection of the fault (as shown in block 1110).

As noted, the decision may be based on whether fault transient data is received from more than one neighboring monitoring devices, such as, for example, neighboring IEDs In some embodiments, the determining of whether to trip the power system switching device, as shown in blocks 1020 and 1120 of FIGS. 10 and 11, respectively, is based further on whether the first monitoring device receives, from a third monitoring device, fault transient information indicating that the electromagnetic transient was detected by the third monitoring device based on sampled current and/or voltage data for a third monitored point in the power system. Fault transient information from even further monitoring devices may be also used in connection with the decision of the whether to activate or trip the circuit breaker or other switching device.

As previously mentioned, according to certain embodiments of the methods illustrated in FIGS. 10 and 11, detecting the fault (as shown at block 1010 of FIG. 10 and block 1110 of FIG. 11) comprises detecting the presence of the fault using phasor calculations based on the sampled current and/or voltage data. In others, detecting the fault comprises detecting the electromagnetic transient at the point monitored by the monitoring device, such as by the first monitoring device, using the sampled current and/or voltage data. According to other embodiments, determining whether to trip the power system switching device may also be based on whether the first monitoring device detects the presence of the fault using phasor calculations based on the sampled current and/or voltage data.

Figure 12:
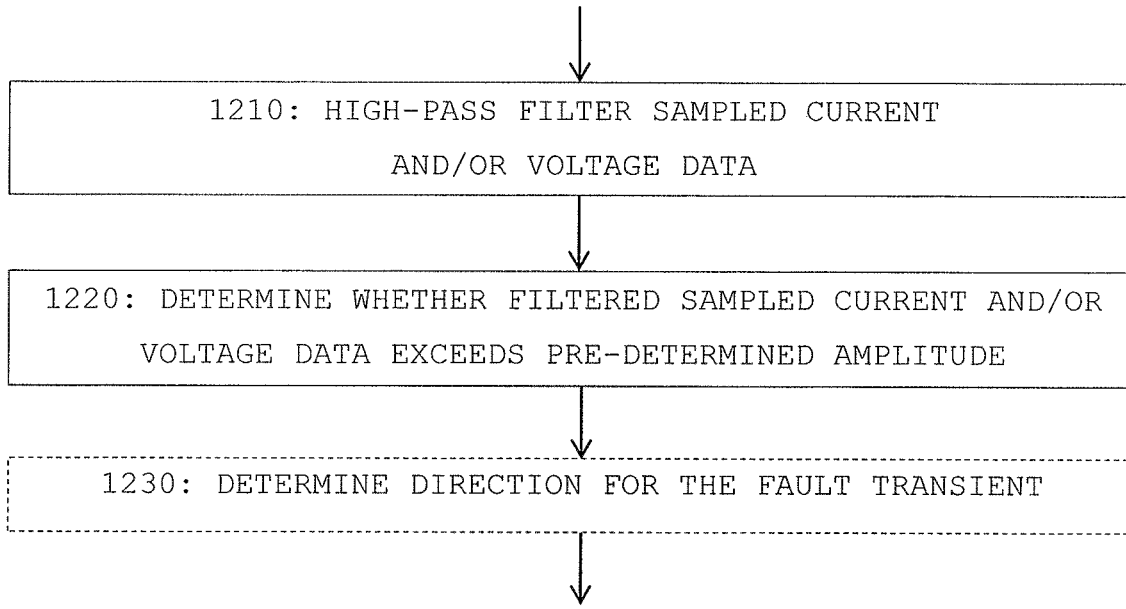
FIG. 12 illustrates an exemplary process for detecting an electromagnetic transient utilizing current and/or voltage amplitude and fault direction.

As shown in FIG. 12, detecting an electromagnetic transient may comprise, in some embodiments, high-pass filtering of the sampled current and/or voltage data and determining whether the filtered sampled current and/or voltage data exceeds a pre-determined amplitude, as shown by blocks 1210 and 1220. Optionally, according to such embodiments where a fault transient is detected locally, the method may further comprise determining by a first monitoring device a fault direction for the electromagnetic transient, based on the sampled current and/or voltage data for the first monitored point in the power system, as shown in FIG. 12 at block 1230. Additionally, determining whether to trip the power system switching device can also be based further on whether fault transient information is received from at least one other monitoring device that includes information indicating a fault direction for the electromagnetic transient that is consistent with the fault direction determined by the first monitoring device. Such consistency in indicated fault direction can include a determination that, when the fault directions are considered together, the fault directions do not indicate different points or regions in the circuit for the originating fault. According to certain embodiments, determining whether to trip the power system switching device can be further based on whether fault transient information received from further additional other monitoring devices includes information indicating a fault direction for the electromagnetic transient that is consistent with a fault direction reported by the at least one other monitoring device. Thus, according to certain embodiments, the fault direction as determined by three or more monitoring devices may be evaluated in connection with determining whether to trip the power system switching device.

Figure 13:
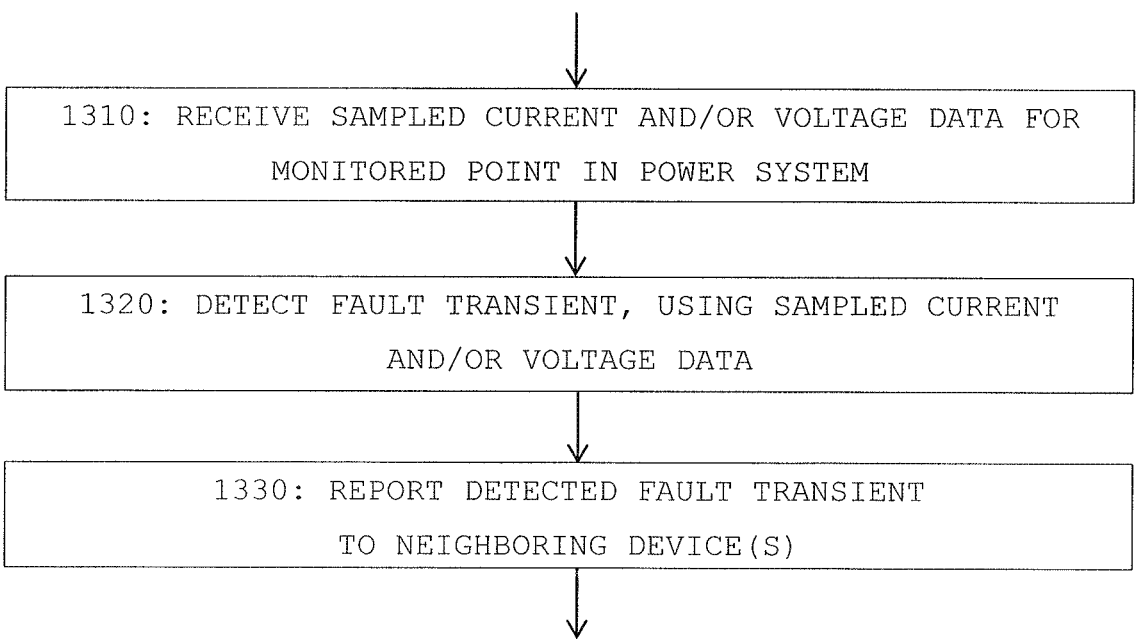
FIG. 13 illustrates an exemplary process flow diagram depicting a generalized method for depicting a fault transient in a power system according to certain embodiments of the present application.

FIG. 10 showed a method as might be carried out in a monitoring device when a fault occurs in the protection area of that monitoring device, and thus includes a decision as to whether or not a switching device should be tripped. FIG. 13 shows another example method, also suitable for implementation in a monitoring device in a power system. The method illustrated in FIG. 13 does not include the decision as to whether to trip the switching device, and thus may correspond to, for example, the process carried out by one or more of the neighboring or at least one other monitoring devices, as discussed above. As shown at block 1310, the method illustrated in FIG. 13 comprises receiving sampled current and/or voltage data for a monitored point in the power system. As shown at block 1320, the method further comprises detecting an electromagnetic transient caused by a fault in the power system, using the first sampled current and/or voltage data. According to certain embodiments, detecting the electromagnetic transient comprises high-pass filtering the sampled current and/or voltage data and determining whether the filtered sampled current and/or voltage data exceeds a pre-determined amplitude, as shown, for example, at blocks 1210 and 1220 of FIG. 12. Further, according to some embodiments, the method further comprises determining a fault direction for the electromagnetic transient, based on the sampled current and/or voltage data for the first monitored point in the power system, as shown, for example, at block 1230 of FIG. 12. The detected electromagnetic transient is then reported to at least one other monitoring device in the power system, as shown at block 1330. Such reporting to another monitoring device(s) can include an indication of the determined fault direction. It will be appreciated that this example method can be combined with any of other methods discussed herein.

Figure 14:
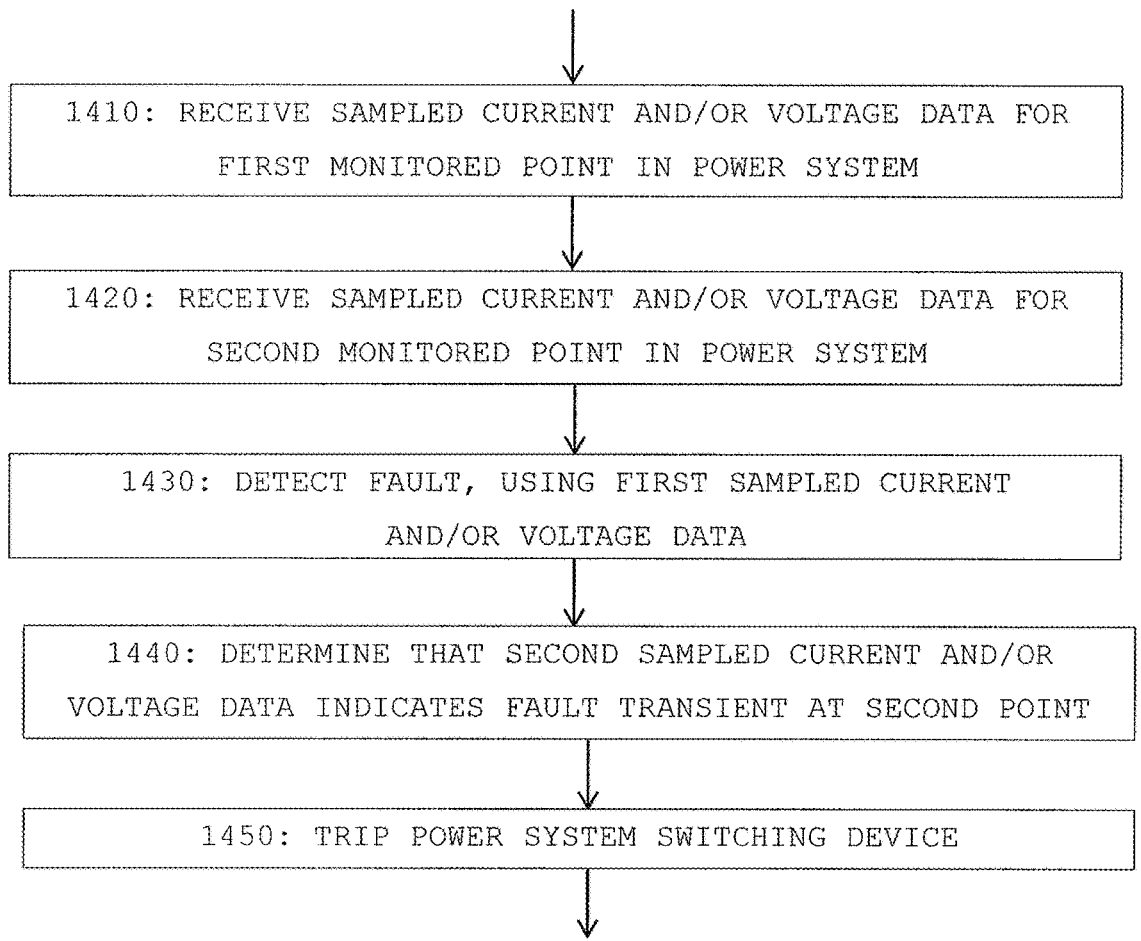
FIG. 14 illustrates an exemplary process flow diagram depicting a generalized method for depicting a fault and tripping a switching device of a power system according to certain embodiments of the present application.

In the method illustrated in FIG. 10, a decision as to whether or not to trip a switching device can be based on fault transient information reported from one or more neighboring monitoring devices. As discussed above in connection with the system design of FIG. 9, however, the decision in some embodiments may be performed using fault transient analysis performed locally, using sampled value data corresponding to monitored points other than the monitoring device's own monitored point. FIG. 14 illustrates another example method in which a first monitoring device in a power system receives first sampled current and/or voltage data for a first monitored point in the power system, as shown at block 1410, and receives second sampled current and/or voltage data for a second monitored point, monitored by a second monitoring device, as shown at block 1420. The first monitoring device detects a fault, as shown at block 1430, using the first sampled current and/or voltage data. As shown at block 1440, the first monitoring device also determines that the second sampled current and/or voltage data indicates the electromagnetic transient at the second monitored point. In response, the first monitoring device determines to trip a power system switching device, as shown at block 1450, in response to the detecting and determining operations shown in blocks 1430 and 1440.

In some embodiments of the method illustrated in FIG. 14, detecting the fault as block 1430 comprises detecting the presence of the fault using phasor calculations based on the first sampled current and/or voltage data. In other embodiments, detecting the fault comprises detecting the electromagnetic transient at the first monitored point, using the first sampled current and/or voltage data. Further, according to certain embodiments, detection of the electromagnetic transit may involve at least a first level transient analysis.

Additionally, according to certain embodiments, determining to trip the power system switching device, as shown in block 1450, can be based further on the first monitoring device detecting the presence of the fault using phasor calculations based on the sampled current and/or voltage data. In some embodiments, the method comprises determining a fault direction for the electromagnetic transient at the first monitored point and determining a fault direction for the electromagnetic transient at the second monitored point, based on the first sampled current and/or voltage data and the second sampled current and/or voltage data, respectively, and determining to trip the power system switching device based further on determining that the fault direction for the electromagnetic transient at the first monitored point is consistent with the fault direction for the electromagnetic transient at the second monitored point.

Figure 15:
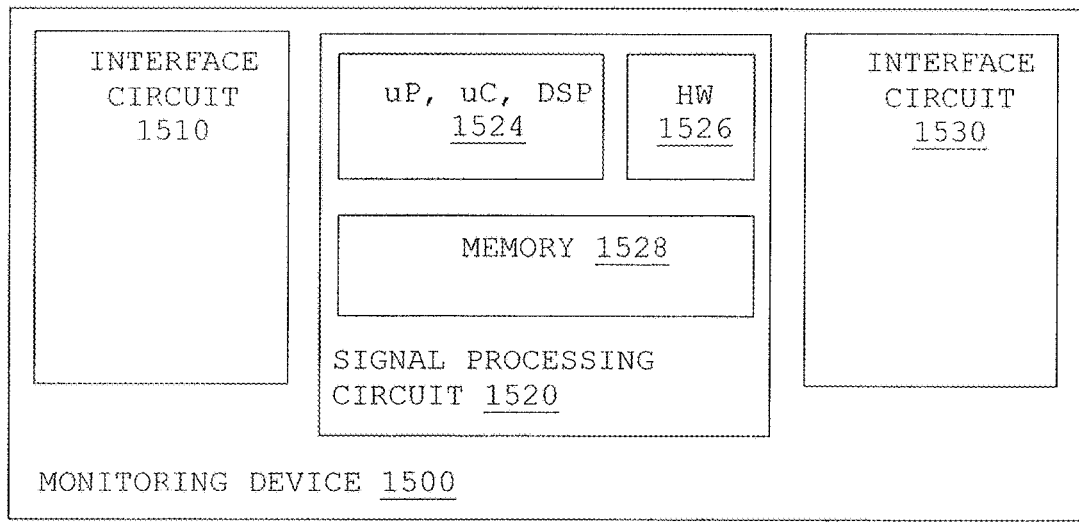
FIG. 15 illustrates a block diagram of certain components of an exemplary monitoring device according to certain embodiments of the present application.

FIG. 15 illustrates an embodiment of a monitoring device 1500, such as, for example, an IED having modified processing circuits and/or interface circuits, that is configured to carry out at least some of the methods discussed herein. According to the illustrated embodiment, the monitoring device 1500 has a first interface circuit 1510 configured to receive sampled current and/or voltage data for a first monitored point in the power system. The monitoring device 1500 further includes a signal processing circuit 1520 configured to detect a fault using the sampled current and/or voltage data. The signal processing circuit 1520 can also be configured to determine whether to trip a power system switching device. Moreover, the signal processing circuit 1520 can be configured to determine, in response to detecting the fault, and based on whether the monitoring device 1500 receives from at least a second monitoring device, fault transient information indicating that an electromagnetic transient caused by the fault was detected by the second monitoring device. As previously mentioned, according to certain embodiments, the received fault transient information can be based on sampled current and/or voltage data for a second monitored point in the power system. Additionally, according to the illustrated embodiment, the received fault transient information can be received via a second interface circuit 1530 of the monitoring device 1500.

According to certain embodiments, the first interface circuit 1510 comprises hardware and, when necessary, supporting software and/or firmware stored in memory, for receiving digital sampled value data from one or several merging units and/or from a common process bus, depending on the system configuration. Further, according to certain embodiments, the first interface circuit 1510 can be configured according to one or more industry standards and/or can implement a proprietary design. Similarly, the second interface circuit 1530 can comprise hardware and, when necessary, supporting software and/or firmware stored in memory, for sending and/or receiving fault transient information to and/or from one or more neighboring monitoring devices. Additionally, according to certain embodiments, the second interface circuit 1530 can be configured according to an industry standard, such as the IEC 61850 station bus.

The signal processing circuit 1520 can comprise one or more microprocessors, microcontrollers, digital signal processors, or the like, designated as processor(s) 1524 in FIG. 15, coupled with or including one or more memory devices 1528. According to certain embodiments, the memory device(s) 1528 store program code for carrying out all or a portion of one or more of the methods discussed above. In some embodiments, the signal processing circuit 1520 may also comprise additional digital hardware 1526 for carrying out one or more of the operations in the above-described methods.

The monitoring device 1500 can also be configured to carry out one or several of the methods described in detail above, as well as variants thereof. Thus, for example, in some embodiments the signal processing circuit 1520 is configured, e.g., with appropriate program code, to receive sampled current and/or voltage data for a first monitored point, via the interface circuit 1510, to detect an electromagnetic transient caused by a fault in the power system, using the first sampled current and/or voltage data, and to report the detected electromagnetic transient to at least one additional monitoring device in the power system, using interface circuit 1530. Similarly, in some of these and/or in other embodiments, the signal processing circuit 1520 is configured to: receive first sampled current and/or voltage data for a first monitored point in the power system; receive second sampled current and/or voltage data for a second monitored point, monitored by a second monitoring device; detect a fault, using the first sampled current and/or voltage data; determine that the second sampled current and/or voltage data indicates an electromagnetic transient at the second monitored point; and determine to trip a power system switching device, in response.

Embodiments of the techniques, apparatuses, and systems described above may be used to address emerging problems in power systems automation and control, and may provide several advantages over existing technology. In particular, the IEC 61850 Process Bus is an emerging technology in power systems' protection and control/substation automation areas. Current implementations of the process bus potentially allow a skilled adversary to sniff, decode and modify the packets on the process bus, and thus manipulate the operation of the IED and the protection system. An attacker could eventually manipulate the power grid into an unstable and insecure operation, causing grid collapse and extensive outages to utility customers. Purely IT-based cyber-security measures such as encryption based techniques have their limitations, such as the required computation performance, complex key management. Furthermore, IT-based cyber-security may not be robust against insider threats. Accordingly, an application of the methods and apparatuses described above provide an add-on domain-based cyber-security layer for the IEDs/MUs and their communication system in a digital substation. By plugging-in the FTSnV module in each IED, deploying and configuring the system of FTSnV modules for each IED, the FTSnV module can monitor and verify the incoming sampled value packets to the IED, detect the manipulated SV packets and blocks IEDs from operating when malicious faked fault packets are detected.

The methods, apparatus, and systems disclosed herein provide manners of securing operation of digital substations during faults. More particularly, the techniques disclosed herein use the analysis of fast fault transients to help verify the fault detection decision of a monitoring device, such as an IED These approaches have several advantages, as the fast transient can be utilized to determine and/or extract a number of physical fault signatures, including, but not limited to, fault direction, fault phase, and/or fault location. Further, fast fault transient can propagate on the primary circuit as EM waves, which is typically faster than the phasors in conventional IED algorithms. Thus, the fault transient signature can be verified before the phasor-based IED fault detection decision. Still further, the fast fault transient propagates over the connected primary circuit. The primary circuit thus forms an alternative "communication" channel for the fault "signature". This primary circuit is generally immune to cyber-only attack. Additionally, the propagation through the primary circuit can allow the fault signature to be verified at multiple locations in a collaborative way. Finally, various methods from traveling wave based protection techniques can be adapted to the presently disclosed techniques for decoding and verifying the transient fault signature.

Accordingly, methods and apparatus of certain embodiments disclosed herein can be used for securing switching devices and systems in a digital substation against cyber-attack on the analog measurement values of the sensors. In a digital substation, analog measurement inputs to the protection algorithms can be digitized as sampled value (SV) streams and transmitted to Intelligent Electronic Devices (IEDs) on the process bus. According to some of the disclosed methods, a physical fault transient signature is extracted from a fast fault transient propagating on the primary circuit, and cross-checked against fault transient signatures corresponding to one or more other measurement locations to verify the validity of the protection system's fault detection decision.

Certain embodiments of the systems described herein include one or more devices or firmware modules that: take sampled value streams as inputs; extract the fault transient signatures from the sampled values; output fault transient signatures; and cross-check the fault transient signatures from multiple measurement sources to verify the fault detection decision of the main protection. Several different configurations for the disclosed systems are possible, depending, for example, on the electrical and communication network's architecture and the processing power of the electronic monitoring and control devices.

An example method according to some of the disclosed techniques is suitable for implementation in a first monitoring device in a power system, such as an IED in a digital substation. According to this example method, a fault is detected, using sampled current and/or voltage data for a first monitored point in the power system. The first monitoring device then determines whether to trip a power system switching device, in response to the detection of the fault. This determining of whether to trip the switching device can be based on whether the first monitoring device receives, from a second monitoring device, first fault transient information indicating that an electromagnetic transient caused by the fault was detected by the second monitoring device based on sampled current and/or voltage data for a second monitored point in the power system.

In some instances and/or embodiments, determining whether to trip the power system switching device comprises determining not to trip the power system switching device upon failing to receive, within a predetermined interval that begins upon detecting the fault, first fault transient information indicating that the electromagnetic transient was detected by the second monitoring device. Likewise, in some instances and embodiments, determining whether to trip the power system switching device comprises determining to trip the power system switching device upon receiving, within a predetermined interval that begins upon detecting the fault, first fault transient information indicating that the electromagnetic transient was detected by the second monitoring device. In some embodiments, determining whether to trip the power system switching device is based further on whether the first monitoring device receives, from a third monitoring device, second fault transient information indicating that the electromagnetic transient was detected by the third monitoring device based on sampled current and/or voltage data for a third monitored point in the power system. Fault transient information from even further additional monitoring devices may also be used in determining whether to trip the power system switching device.

According to certain embodiments, detecting the fault comprises detecting the presence of the fault using phasor calculations based on the sampled current and/or voltage data. In others, detecting the fault comprises detecting the electromagnetic transient, using the sampled current and/or voltage data. According to certain embodiments, determining whether to trip the power system switching device can also be based on whether the first monitoring device detects the presence of the fault using phasor calculations based on the sampled current and/or voltage data. Detecting the electromagnetic transient may comprise, in some embodiments, high-pass filtering the sampled current and/or voltage data and determining whether the filtered sampled current and/or voltage data exceeds a pre-determined amplitude.

According to certain embodiments in which a fault transient is detected locally, the method can further include determining a fault direction for the electromagnetic transient, based on the sampled current and/or voltage data for the first monitored point in the power system. In such embodiments, determining whether to trip the power system switching device can be further based on whether the first fault transient information received from the second monitoring device includes information indicating a fault direction for the electromagnetic transient that is consistent with the fault direction determined by the first monitoring device. According to certain embodiments, determining whether to trip the power system switching device can be based further on whether second fault transient information received from a third monitoring device includes information indicating a fault direction for the electromagnetic transient that is consistent with a fault direction reported by the second monitoring device.

Another example method, also suitable for implementation in a monitoring device in a power system, comprises receiving sampled current and/or voltage data for a monitored point in the power system and detecting an electromagnetic transient caused by a fault in the power system, using the first sampled current and/or voltage data. The detected electromagnetic transient can then be reported to at least one additional monitoring device in the power system. This example method can be combined with any of other methods discussed herein.

Additionally, according to certain embodiments, detecting the electromagnetic transient comprises high-pass filtering of the sampled current and/or voltage data and determining whether the filtered sampled current and/or voltage data exceeds a pre-determined amplitude. In some embodiments, the method further comprises determining a fault direction for the electromagnetic transient, based on the sampled current and/or voltage data for the first monitored point in the power system, and including an indication of the determined fault direction when reporting the detected electromagnetic transient to the at least one additional monitoring device.

According to another example method, a first monitoring device in a power system receives first sampled current and/or voltage data for a first monitored point in the power system and receives second sampled current and/or voltage data for a second monitored point, monitored by a second monitoring device. The first monitoring device detects a fault, using the first sampled current and/or voltage data, and determines that the second sampled current and/or voltage data indicates an electromagnetic transient caused by the fault at the second monitored point. In response, the first monitoring device determines to trip a power system switching device, in response to said detecting and based on said determining.

In some embodiments of this latter example method, detecting the fault comprises detecting the presence of the fault using phasor calculations based on the first sampled current and/or voltage data. In other embodiments, detecting the fault comprises detecting the electromagnetic transient at the first monitored point, using the first sampled current and/or voltage data. In some of these latter embodiments, determining to trip the power system switching device is based further on the first monitoring device detecting the presence of the fault using phasor calculations based on the sampled current and/or voltage data. In some embodiments, the method comprises determining a fault direction for the electromagnetic transient at the first monitored point and determining a fault direction for the electromagnetic transient at the second monitored point, based on the first sampled current and/or voltage data and the second sampled current and/or voltage data, respectively, and determining to trip the power system switching device based further on determining that the fault direction for the electromagnetic transient at the first monitored point is consistent with the fault direction for the electromagnetic transient at the second monitored point.

While the invention has been described in connection with what is presently considered to be the most practical and preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

The invention claimed is:

1. A method comprising:
   detecting, by a first monitoring device, a fault in a power system,;
   detecting, by one or more other monitoring devices, one or more fault transients;
   receiving, by the first monitoring device, an indication of the detection, by the one or more other monitoring devices, of the one or more fault transients
   determining to trip a switching device of a power system in response to the detected fault and the detected one or more fault transients, wherein the step of determining to trip the switching device includes determining whether the first monitoring device received an indication of the detection of the one or more fault transients within a predetermined time period;
   determining, by the first monitoring device and using first sampled data of a first monitoring point of the power system, a first fault direction of a first fault transient; and
   determining, by the one or more other monitoring devices and using sampled data of at least a second monitoring point of the power system, a second fault direction of at least one of the one or more fault transients,
   wherein the step of determining to trip the switching device includes determining whether the first fault direction is consistent with the second fault direction,
   wherein determining the first fault direction comprises:
      calculating an instantaneous energy direction for the first fault transient by obtaining a decoupled mode voltage and a decoupled mode current for each of several tracked fault component voltages and currents;
      calculating instantaneous active power and instantaneous reactive power for each of the decoupled mode voltages and decoupled mode currents;
      accumulating the instantaneous active powers and instantaneous reactive powers to form instantaneous active energies and reactive energies; and
      evaluating the signs of the instantaneous active energies and reactive energies to determine the fault direction for the electromagnetic transient.

2. A method comprising: detecting, by a first monitoring device, a fault in a power system, detecting the fault comprises detecting a presence of the fault using phasor calculations; detecting one or more fault transients, the one or more fault transients being generated by electromagnetic fault transients propagating in a substation of the power system; confirming, by the first monitoring device, based on detection of the fault and the detection of the one or more fault generated electromagnetic fault transients in the substation, the presence of the fault in the power system; and determining, by the first monitoring device, to trip a switching device of a power system in response to the confirmed presence of the detected fault; and wherein the first sampled data comprises at least one of a first sampled current data and a first sampled voltage data, and wherein the step of detecting one or more fault transients comprises detecting, by a second monitoring device, one or more fault transients using second sampled data, the second sampled data comprising at least one of a second sampled current data and a second sampled voltage data.

3. The method of claim 2, wherein the step of detecting the one or more fault transients comprises:
   high-pass filtering the second sampled data; and
   determining whether the filtered second sampled data exceeds a pre-determined amplitude.

4. The method of claim 2, wherein the step of detecting the one or more fault transients is performed by one or more other monitoring devices.

5. The method of claim 4, further including the step of receiving, by the first monitoring device, an indication of the detection, by the one or more other monitoring devices, of the one or more fault transients.

6. The method of claim 5, wherein the step of determining to trip the switching device includes determining whether the first monitoring device received an indication of the detection of the one or more fault transients within a predetermined time period.

7. The method of claim 6, further including the steps of:
   determining, by the first monitoring device and using first sampled data of a first monitoring point of the power system, a first fault direction of a first fault transient; and
   determining, by the one or more other monitoring devices and using sampled data of at least a second monitoring point of the power system, a second fault direction of at least one of the one or more fault transients, wherein the step of determining to trip the switching device includes determining whether the first fault direction is consistent with the second fault direction.

8. The method of claim 7, wherein determining the first fault direction comprises:
calculating an instantaneous energy direction for the first fault transient by obtaining a decoupled mode voltage and a decoupled mode current for each of several tracked fault component voltages and currents;
calculating instantaneous active power and instantaneous reactive power for each of the decoupled mode voltages and decoupled mode currents;
accumulating the instantaneous active powers and instantaneous reactive powers to form instantaneous active energies and reactive energies; and
evaluating the signs of the instantaneous active energies and reactive energies to determine the fault direction for the electromagnetic transient.

9. The method of claim 2, wherein the step of detecting the fault includes receiving, by a first monitoring device, first sampled data for a first monitored point in the power system and detecting the fault using the first sampled data, and wherein the step of detecting the one or more fault transients includes receiving second sampled data for a second monitored point and determining that the second sampled data indicates a fault transient at the second monitored point.

10. The method of claim 9, further including the steps:
determining a first direction for a first fault transient at the first monitored point; and
determining a second direction for the fault transient at the second monitored point,
wherein the step of determining to trip the switching device includes determining whether the first fault direction is consistent with the second fault direction.

* * * * *